United States Patent
Ohnuma

(10) Patent No.: US 8,198,165 B2
(45) Date of Patent: Jun. 12, 2012

(54) METHOD FOR MANUFACTURING SEMICONDUCTOR DEVICE

(75) Inventor: Hideto Ohnuma, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 13/222,286

(22) Filed: Aug. 31, 2011

(65) Prior Publication Data

US 2011/0318896 A1     Dec. 29, 2011

Related U.S. Application Data

(62) Division of application No. 12/760,573, filed on Apr. 15, 2010, now Pat. No. 8,026,144, and a division of application No. 12/263,592, filed on Nov. 3, 2008, now Pat. No. 7,749,850.

(30) Foreign Application Priority Data

Nov. 7, 2007  (JP) ................................. 2007-289750

(51) Int. Cl.
    *H01L 21/336* (2006.01)

(52) U.S. Cl. ................ 438/300; 438/301; 257/E21.619; 257/21.634

(58) Field of Classification Search .................. 438/149, 438/197, 300, 301; 257/E21.619, E21.634
    See application file for complete search history.

(56) References Cited

U.S. PATENT DOCUMENTS

| | | | |
|---|---|---|---|
| 4,072,545 A | 2/1978 | De La Moneda | |
| 5,583,366 A | 12/1996 | Nakazawa | |
| 5,828,103 A | 10/1998 | Hsu | |
| 6,063,675 A | 5/2000 | Rodder | |
| 6,306,712 B1 | 10/2001 | Rodder et al. | |
| 7,303,966 B2 | 12/2007 | Kim et al. | |
| 7,772,054 B2 | 8/2010 | Ohnuma | |
| 7,851,318 B2 * | 12/2010 | Koyama et al. | 438/311 |

OTHER PUBLICATIONS

He, et al., "Raised Source and Drain Structure of Poly-SI TFTS", Electrochemical Society Proceeding, vol. 98-22, pp. 204-220.

\* cited by examiner

*Primary Examiner* — Hoai V Pham
(74) *Attorney, Agent, or Firm* — Nixon Peabody LLP; Jeffrey L. Costellia

(57) ABSTRACT

In a semiconductor device having a raised source and drain structure, in forming a raised region by etching, etching of an island-like semiconductor film which is an active layer is inhibited. In a method for manufacturing a semiconductor device, an insulating film is formed by oxidizing or nitriding the surface of an island-like semiconductor film, a semiconductor film is formed on a region which is a part of the insulating film, a gate electrode is formed over the insulating film, an impurity element imparting one conductivity type is added to the island-like semiconductor film and the semiconductor film using the gate electrode as a mask, the impurity element is activated by heating the island-like semiconductor film and the semiconductor film, and the part of the insulating film between the island-like semiconductor film and the semiconductor film disappears by heating the island-like semiconductor film and the semiconductor film.

5 Claims, 23 Drawing Sheets

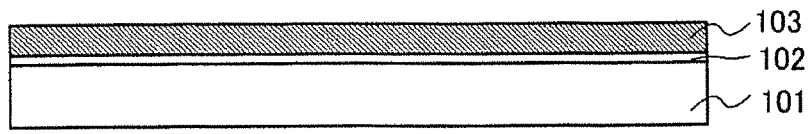
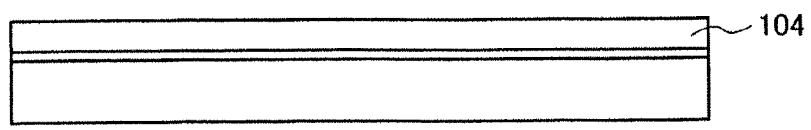
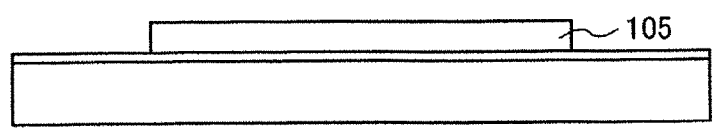
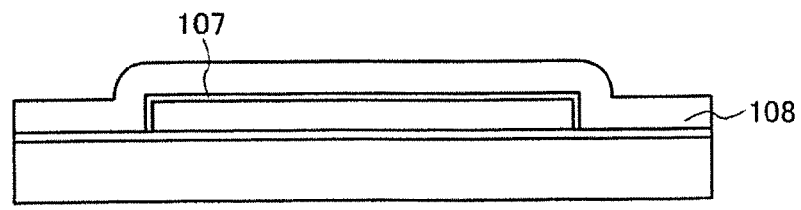
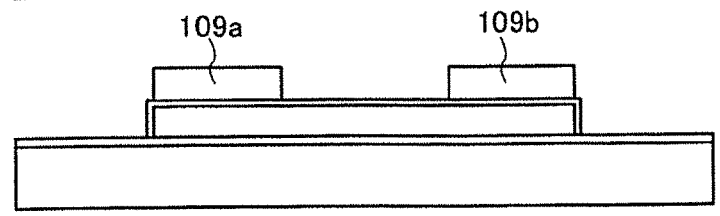
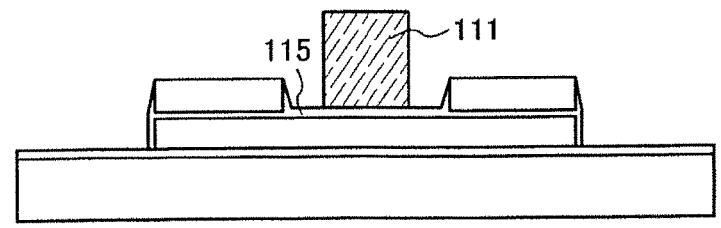
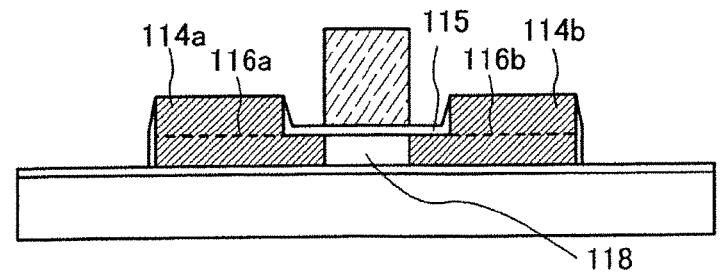
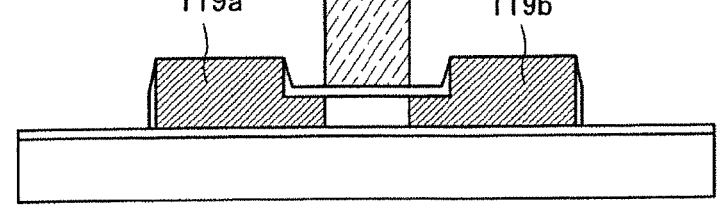

PRIOR ART

200

200

200

200

200

200

METHOD FOR MANUFACTURING SEMICONDUCTOR DEVICE

BACKGROUND OF THE INVENTION

1. Field of the Invention

The present invention relates to a method for manufacturing a semiconductor device.

2. Description of the Related Art

In the field of LSI, raised source and drain regions are being developed, and the use of raised source and drain regions also in the field of thin films for manufacturing thin film transistors and the like is under consideration. In the field of LSI, a selective epitaxial method which is a high-temperature process is used to form raised source and drain regions. However, in the field of thin films, a high-temperature process cannot be used when glass substrates and the like are used, and it is difficult to achieve raised source and drain regions.

In the field of thin films, an n-type amorphous silicon ($n^+$-Si) film is formed over a crystalline semiconductor film, and an attempt to etch the n-type amorphous silicon film without etching the crystalline semiconductor film is made by utilizing a difference in etching rate between both the films in dry etching (see Reference 1: "Raised source and drain structure of poly-Si TFT", Shusheng He and Jershen Maa, Electrochemical Society Proceeding, Volume 98-22, pp. 204-220).

FIG. 2 shows a structure of a thin film transistor disclosed in Reference 1. In FIG. 2, a crystalline semiconductor film 1002 with a thickness of 100 nm, a gate oxide film 1003, and a gate electrode 1005 are provided over a quartz substrate or a silicon substrate 1001 provided with an oxide film with a thickness of 200 nm. N-type amorphous silicon films 1004a and 1004b with a thickness of 100 nm each are formed over the crystalline semiconductor film 1002.

Further, a silicon oxide film 1006 with a thickness of 100 nm is formed. Over and in the silicon oxide film 1006, source and drain electrodes 1007a and 1007b are formed so as to be connected to the n-type amorphous silicon films 1004a and 1004b, respectively.

SUMMARY OF THE INVENTION

With a large thickness of the crystalline semiconductor film 1002 (100 nm in Reference 1), even if an etching rate ratio between the crystalline semiconductor film 1002 and the n-type amorphous silicon ($n^+$-Si) films 1004a and 1004b is not high, only the n-type amorphous silicon ($n^+$-Si) films 1004a and 1004b can be etched without etching the crystalline semiconductor film 1002 away, by stopping the etching in the process.

However, with a small thickness (e.g., less than or equal to 40 nm) of the crystalline semiconductor film 1002, even if there is a difference in etching rate, not only the n-type amorphous silicon ($n^+$-Si) films 1004a and 1004b but also the crystalline semiconductor film 1002 could possibly be etched away.

In the case of forming a CMOS transistor, it is necessary to form and etch also a p-type amorphous silicon ($p^+$-Si) film; thus, there is a concern that the manufacturing process gets complicated and unstable.

In the present invention, an oxide film, an oxide film including nitrogen, a nitride film including oxygen, or a nitride film, which is formed using a semiconductor film and very thin, is formed on a first semiconductor film, and further, a second semiconductor film is formed thereon. In etching the second semiconductor film, the oxide film, the oxide film including nitrogen, the nitride film including oxygen, or the nitride film, which is very thin, serves as an etching stopper and prevents the first semiconductor film from being etched.

By introducing an impurity element imparting one conductivity type and activating the impurity element by heat treatment, oxygen or nitrogen diffuses in the oxide film, the oxide film including nitrogen, the nitride film including oxygen, or the nitride film, which is formed using the semiconductor film and very thin, between the first and second semiconductor films, and thus, the oxide film, the oxide film including nitrogen, the nitride film including oxygen, or the nitride film, which is very thin, disappears. Accordingly, a source region and a drain region are formed.

Further, in introduction of the impurity element imparting one conductivity type, oxygen or nitrogen in the oxide film or the nitride film jumps out by collision of the impurity element. Therefore, the oxygen concentration or the nitrogen concentration in the oxide film or the nitride film is decreased.

The present invention relates to a method for manufacturing a semiconductor device which will be described below.

According to an aspect of the present invention, in a method for manufacturing a semiconductor device, an island-like semiconductor film is formed over a substrate having an insulating surface; the surface of the island-like semiconductor film is oxidized or nitrided to form a first insulating film which is any one of an oxide film, an oxide film including nitrogen, a nitride film including oxygen, a nitride film, a film including a suboxide, and a film including a subnitride on the surface of the island-like semiconductor film; a semiconductor film is formed on a region which is a part of the first insulating film; the surface of the island-like semiconductor film is oxidized or nitrided to form a second insulating film which is any one of an oxide film, an oxide film including nitrogen, a nitride film including oxygen, and a nitride film on the surface of the island-like semiconductor film; a gate electrode is formed over the first insulating film and the second insulating film which serve as a gate insulating film; an impurity element imparting one conductivity type is added to the island-like semiconductor film and the semiconductor film using the gate electrode as a mask; the island-like semiconductor film and the semiconductor film are heated to activate the impurity element which is added to the island-like semiconductor film and the semiconductor film; and the first insulating film between the island-like semiconductor film and the semiconductor film disappears by heating the island-like semiconductor film and the semiconductor film.

According to another aspect of the present invention, in a method for manufacturing a semiconductor device, an island-like semiconductor film is formed over a substrate having an insulating surface; the surface of the island-like semiconductor film is oxidized or nitrided to form a first insulating film which is any one of an oxide film, an oxide film including nitrogen, a nitride film including oxygen, a nitride film, a film including a suboxide, and a film including a subnitride, which is formed using the island-like semiconductor film, on the surface of the island-like semiconductor film; a semiconductor film is formed on a region which is a part of the first insulating film; the surface of the island-like semiconductor film is oxidized or nitrided to form a second insulating film which is any one of an oxide film, an oxide film including nitrogen, a nitride film including oxygen, and a nitride film on the surface of the island-like semiconductor film; a third insulating film is formed over the first insulating film and the second insulating film; a gate electrode is formed over the third insulating film; an impurity element imparting one conductivity type is added to the island-like semiconductor film and the semiconductor film using the gate electrode as a mask; the island-like semiconductor film and the semiconductor film are heated to activate the impurity element which is added to the island-like semiconductor film and the semiconductor film; and the first insulating film between the island-like semiconductor film and the semiconductor film disappears by heating the island-like semiconductor film and the semiconductor film.

According to another aspect of the present invention, in a method for manufacturing a semiconductor device, an island-like semiconductor film is formed over a substrate having an insulating surface; the surface of the island-like semiconductor film is oxidized or nitrided to form a first insulating film which is any one of an oxide film, an oxide film including nitrogen, a nitride film including oxygen, a nitride film, a film including a suboxide, and a film including a subnitride on the surface of the island-like semiconductor film; a semiconductor film is formed on a region which is a part of the first insulating film; the first insulating film except for a region interposed between the island-like semiconductor film and the semiconductor film is removed to expose the island-like semiconductor film in a region where the semiconductor film is not formed; the surface of the island-like semiconductor film and the semiconductor film are oxidized or nitrided to form a second insulating film which is any one of an oxide film, an oxide film including nitrogen, a nitride film including oxygen, a nitride film, a film including a suboxide, and a film including a subnitride; a gate electrode is formed over the second insulating film which is formed in a region where the island-like semiconductor film is exposed; an impurity element imparting one conductivity type is added to the island-like semiconductor film and the semiconductor film using the gate electrode as a mask; the island-like semiconductor film and the semiconductor film are heated to activate the impurity element which is added to the island-like semiconductor film and the semiconductor film; and the first insulating film disappears by heating the island-like semiconductor film and the semiconductor film.

According to another aspect of the present invention, in a method for manufacturing a semiconductor device, an island-like semiconductor film is formed over a substrate having an insulating surface; the surface of the island-like semiconductor film is oxidized or nitrided to form a first insulating film which is any one of an oxide film, an oxide film including nitrogen, a nitride film including oxygen, a nitride film, a film including a suboxide, and a film including a subnitride on the surface of the island-like semiconductor film; a semiconductor film is formed on a region which is a part of the first insulating film; the first insulating film except for a region interposed between the island-like semiconductor film and the semiconductor film is removed to expose the island-like semiconductor film in a region where the semiconductor film is not formed; a second insulating film is formed in a region where the island-like semiconductor film is exposed; a gate electrode is formed over the second insulating film; an impurity element imparting one conductivity type is added to the island-like semiconductor film and the semiconductor film using the gate electrode as a mask; the island-like semiconductor film and the semiconductor film are heated to activate the impurity element which is added to the island-like semiconductor film and the semiconductor film; and the first insulating film disappears by heating the island-like semiconductor film and the semiconductor film.

According to another aspect of the present invention, in a method for manufacturing a semiconductor device, an island-like semiconductor film is formed over a substrate having an insulating surface; an insulating film is formed over the island-like semiconductor film; a gate electrode is formed over the insulating film; a sidewall is formed on a side surface of the gate electrode; the insulating film in a region where the gate electrode or the sidewall is not formed is etched to expose the island-like semiconductor film in the region where the gate electrode or the sidewall is not formed; the island-like semiconductor film which is exposed is oxidized or nitrided to form a first insulating film which is any one of an oxide film, an oxide film including nitrogen, a nitride film including oxygen, a nitride film, a film including a suboxide, and a film including a subnitride; a first semiconductor film is formed so as to cover the first insulating film, the gate electrode, and the sidewall; the first semiconductor film is etched to form a second semiconductor film on a region which is a part of the island-like semiconductor film and a part of the first insulating film; an impurity element imparting one conductivity type is added to the island-like semiconductor film and the second semiconductor film; the island-like semiconductor film and the second semiconductor film are heated to activate the impurity element, which is added to the island-like semiconductor film and the second semiconductor film; and the first insulating film between the island-like semiconductor film and the second semiconductor film disappears by heating the island-like semiconductor film and the second semiconductor film.

In the present invention, the island-like semiconductor film is a crystalline semiconductor film whose main component is silicon, and the semiconductor film is a semiconductor film whose main component is silicon.

In the present invention, the island-like semiconductor film is a crystalline semiconductor film whose main component is silicon, and the first semiconductor film is a semiconductor film whose main component is silicon.

In the present invention, the island-like semiconductor film is a single crystal semiconductor layer whose main component is silicon, and the semiconductor film is a semiconductor film whose main component is silicon.

In the present invention, the island-like semiconductor film is a single crystal semiconductor layer whose main component is silicon, and the first semiconductor film is a semiconductor film whose main component is silicon.

In the present invention, the third insulating film is formed using any one of a silicon oxide film, a silicon oxide film including nitrogen, a silicon nitride film, and a silicon nitride film including oxygen, or a stacked film including two or more of them.

In the present invention, the second insulating film is formed using any one of a silicon oxide film, a silicon oxide film including nitrogen, a silicon nitride film, and a silicon nitride film including oxygen, or a stacked film including two or more of them.

In the present invention, the thickness of the oxide film, the oxide film including nitrogen, the nitride film including oxygen, the nitride film, the film including a suboxide, or the film including a subnitride is 0.2 to 4 nm inclusive.

In the present invention, the thickness of the oxide film, the oxide film including nitrogen, the nitride film including oxygen, the nitride film, the film including a suboxide, or the film including a subnitride is 0.5 to 3 nm inclusive.

In this specification, semiconductor devices mean elements and devices in general, which function by utilization of a semiconductor, and also include electronic devices provided with elements which function by utilization of a semiconductor in its category.

It is possible to form a thin film transistor having raised source and drain regions without heating a substrate at high temperature. In the thin film transistor, raised low-resistance regions can be formed over a semiconductor film.

In a method for manufacturing a thin film transistor having a raised structure, a raised region can be formed without etching an island-like semiconductor film which is an active layer.

BRIEF DESCRIPTION OF THE DRAWINGS

FIGS. 1A to 1H are cross-sectional views showing a manufacturing process of a semiconductor device according to an aspect of the present invention.

DETAILED DESCRIPTION OF THE INVENTION

Figure 2:
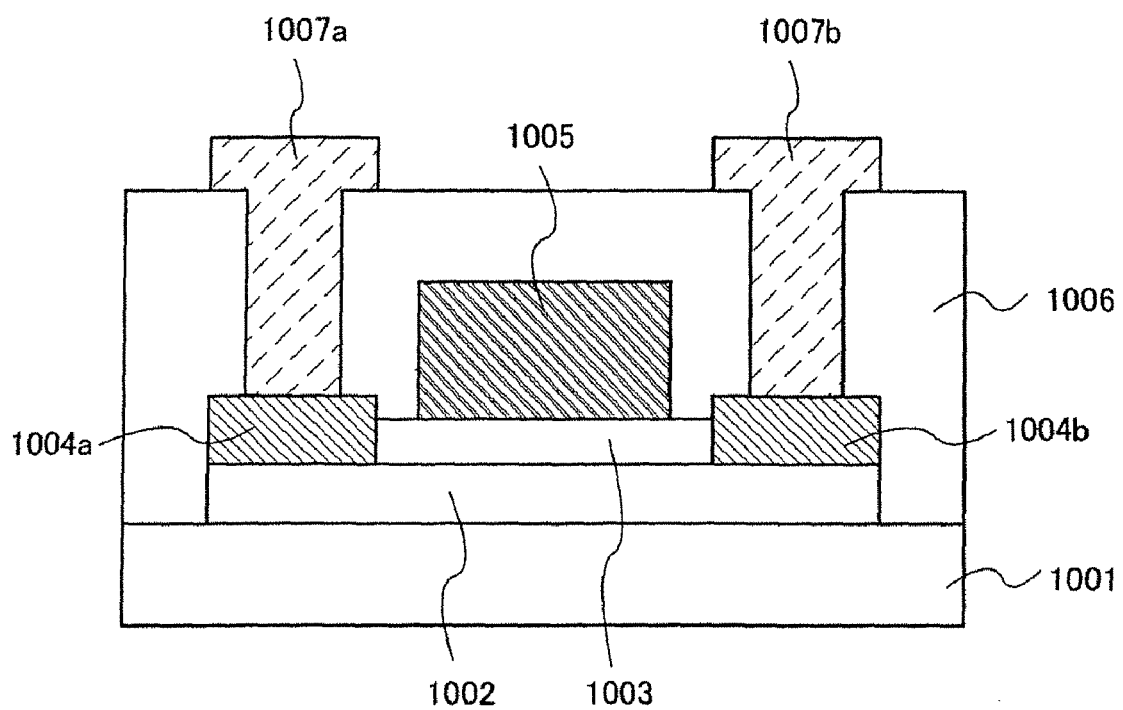
FIG. 2 is a cross-sectional view of a conventional semiconductor device.

Hereinafter, the present invention will be described with reference to the drawings. Note that the present invention can be implemented in many different modes, and it is easily understood by those skilled in the art that the modes and details disclosed herein can be modified in various ways without departing from the spirit and scope of the present invention. Therefore, the present invention should not be interpreted as being limited to the description of the embodiment modes to be given below.

In all the drawings for describing the embodiment modes, the like parts or parts having like functions are denoted by the same reference numerals; and the description of them will not be repeated.

Embodiment Mode 1

In this embodiment mode, a method for manufacturing a thin film transistor which has raised low-resistance regions will be described with reference to FIGS. 1A to 1H, FIGS. 10A to 10E, FIGS. 11A to 11F, and FIGS. 23A to 23E.

Over a substrate 101, a base insulating film 102, and further, an amorphous semiconductor film 103 are formed (see FIG. 1A). As the substrate 101, a glass substrate, a quartz substrate, or the like may be used. In this embodiment mode, a glass substrate is used as the substrate 101.

As the base insulating film 102, any one of a silicon oxide film, a silicon oxide film including nitrogen, a silicon nitride film including oxygen, and a silicon nitride film, or a stacked film including two or more of them may be used. In this embodiment mode, a silicon oxide film including nitrogen and a silicon nitride film including oxygen are stacked to form the base insulating film 102. The base insulating film 102 is not necessarily formed.

By use of a glass substrate, a quartz substrate, or the like for the substrate 101, the surface of the substrate 101 has an insulating property. Also, the substrate 101 provided with the base insulating film 102 can be regarded as a substrate having an insulating surface.

In this embodiment mode, as the amorphous semiconductor film 103, a semiconductor film whose main component is silicon, e.g., an amorphous silicon film is formed to have a thickness of 10 to 100 nm. A semiconductor film whose main component is germanium may also be used as the semiconductor film. Examples of the semiconductor film whose main component is silicon or germanium are a silicon film, a germanium film, and a silicon-germanium film.

Then, the amorphous semiconductor film 103 is crystallized by a known method such as laser irradiation or heating, whereby a crystalline semiconductor film 104 is formed (see FIG. 1B). In this embodiment mode, since the amorphous semiconductor film 103 is the amorphous silicon film, a crystalline silicon film is formed as the crystalline semiconductor film 104.

Instead of forming the base insulating film 102 and the crystalline semiconductor film 104 over the substrate 101, a silicon on insulator (SOI) substrate may be used.

The case of using an SOI substrate will be described below.

First, structures of substrates having an SOI structure will be described with reference to FIGS. 12A and 1213, and FIGS. 13A to 13C.

Figure 12A:
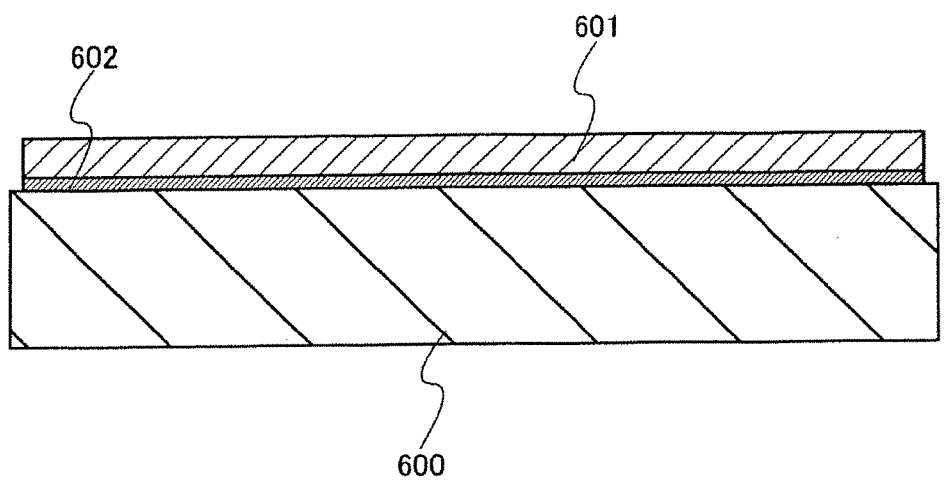
FIGS. 12A and 12B are cross-sectional views each showing an SOI substrate according to an aspect of the present invention.

In FIG. 12A, a supporting substrate 600 is a substrate having an insulating property or a substrate having an insulating surface, and a glass substrate (also referred to as a "non-alkali glass substrate") that is used in the electronics industry, such as an aluminosilicate glass substrate, an aluminoborosilicate glass substrate, or a barium borosilicate glass substrate, is used.

In other words, a glass substrate that has a thermal expansion coefficient of $25 \times 10^{-7}$ to $50 \times 10^{-7}/°$ C. (preferably $30 \times 10^{-7}$ to $40 \times 10^{-7}/°$ C.) and a strain point of 580 to 680° C. (preferably 600 to 680° C.) can be used for the supporting substrate 600. In addition, a quartz substrate, a ceramic substrate, a metal substrate having a surface covered with an insulating film, or the like can be used.

A low-temperature single crystal semiconductor (LTSS) layer 601 is a single crystal semiconductor layer. A single crystal semiconductor layer whose main component is silicon, a single crystal semiconductor layer whose main component is germanium, or the like is used, and typically, single crystal silicon is used for the LTSS layer 601.

Alternatively, as the LTSS layer 601, a crystalline semiconductor layer of a compound semiconductor such as gallium arsenide or indium phosphide, which can be separated from a single crystal semiconductor substrate or a polycrystalline semiconductor substrate by a hydrogen ion implantation separation method, can be used.

Between the supporting substrate 600 and the LTSS layer 601, a bonding layer 602 which has a smooth surface and forms a hydrophilic surface is provided. The bonding layer 602 is a layer which has a smooth surface and a hydrophilic surface. As a layer which can form such a surface, an insulating layer formed by a chemical reaction is preferable. For example, an oxide semiconductor film formed by a thermal or chemical reaction is suitable. The main reason is that a film formed by a chemical reaction can ensure its surface smoothness.

The bonding layer 602 which has a smooth surface and forms a hydrophilic surface is provided with a thickness of 0.2 to 500 nm. With this thickness, it is possible to smooth roughness of a surface where the film is to be formed and also to ensure smoothness of a growth surface of the film.

When the LTSS layer 601 is formed of silicon, the bonding layer 602 can be formed using silicon oxide which is formed by heat treatment in an oxidizing atmosphere, silicon oxide which grows by a reaction of oxygen radicals, a chemical oxide which is formed with an oxidizing chemical solution, or the like.

When a chemical oxide is used for the bonding layer 602, the bonding layer 602 may have a thickness of 0.2 to 3 nm. Preferably, the bonding layer 602 is formed of silicon oxide which is deposited by a chemical vapor deposition method. In this case, a silicon oxide film formed by a chemical vapor deposition method using an organosilane gas is preferable.

Examples of the organosilane gas which can be used are compounds including silicon such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$).

The bonding layer 602 is provided on the LTSS layer 601 side and disposed in close contact with the surface of the supporting substrate 600, whereby a bond can be formed even at room temperature. In order to form a stronger bond, the supporting substrate 600 and the LTSS layer 601 may be pressed against each other. In bonding the supporting substrate 600 and the bonding layer 602 which are of different kinds of materials, the surfaces are cleaned. When the cleaned surface of the supporting substrate 600 and that of the bonding layer 602 are disposed in close contact with each other, a bond is formed by an attracting force between the surfaces.

It is more preferable for formation of a bond that the surface of the supporting substrate 600 be subjected to treatment for attaching a plurality of hydrophilic groups to the surface. For example, it is preferable that the surface of the supporting substrate 600 be subjected to oxygen plasma treatment, ozone treatment, or treatment that is soaking in ozone water so that the surface becomes hydrophilic.

When the surface of the supporting substrate 600 is subjected to treatment for making the surface hydrophilic, hydroxyl groups on the surface act and a bond by hydrogen bonds is formed. Further, the bond between the cleaned surfaces, which is formed by making the surfaces closely contact with each other, can be strengthened by being heated at a temperature greater than or equal to room temperature.

As treatment for bonding the supporting substrate 600 and the bonding layer 602 which are of different kinds of materials, surfaces which are to form a bond may be cleaned by being irradiated with an ion beam obtained from an inert gas such as argon. By irradiation with the ion beam, dangling bonds are exposed on the surface of the supporting substrate 600 or the bonding layer 602, and an extremely active surface is formed.

If such activated surfaces are disposed in close contact with each other, a bond between the supporting substrate 600 and the bonding layer 602 can be formed even at low temperature. A method for forming a bond after surface activation is preferably performed in vacuum because the each surface needs to have a high degree of cleanness.

The LTSS layer 601 is formed with a thin layer separated from a crystalline semiconductor substrate. For example, when a single crystal silicon substrate is used as a single crystal semiconductor substrate, the LTSS layer 601 can be formed as follows: the single crystal silicon substrate is doped with hydrogen cluster ions ($H_2^+$, $H_3^+$) at a predetermined depth by an ion doping method which performs doping without mass separation of ions, and heat treatment is performed to separate a superficial single crystal silicon layer. Alternatively, hydrogen ions ($H^+$) or hydrogen cluster ions may be implanted by an ion implantation method.

Alternatively, a method may be employed in which single crystal silicon is epitaxially grown on porous silicon and then a porous silicon layer is separated by cleavage with water jetting. The thickness of the LTSS layer 601 is 5 to 500 nm, preferably 10 to 200 nm.

Figure 12B:
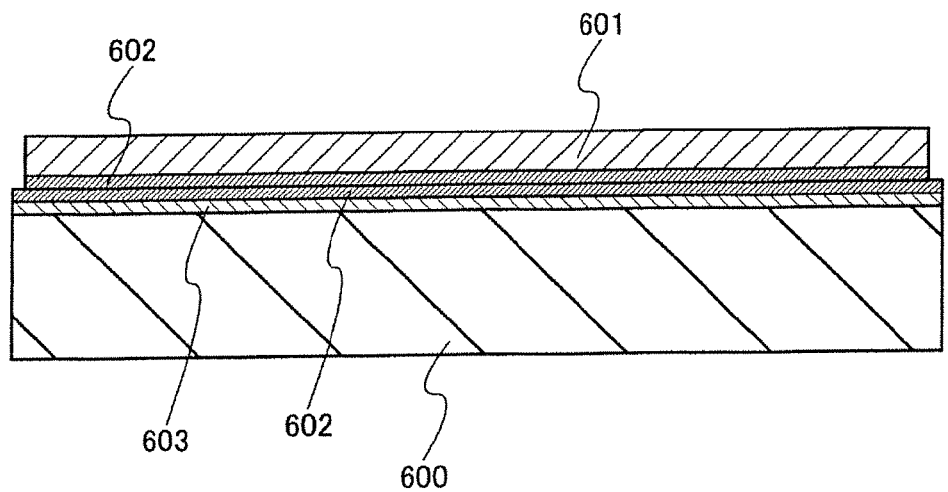

FIG. 12B shows a structure in which a supporting substrate 600 is provided with a barrier layer 603 and a bonding layer 602. By providing the barrier layer 603, an LTSS layer 601 can be prevented from being contaminated by a mobile ion impurity like alkali metal or alkaline earth metal that is diffused from a glass substrate which is used as the supporting substrate 600. The bonding layer 602 is preferably provided over the barrier layer 603.

By providing the barrier layer 603 which prevents impurity diffusion and the bonding layer 602 which ensures bonding strength, that is, a plurality of layers with different functions over the supporting substrate 600, the range of choices of the supporting substrate can be expanded. It is preferable that the bonding layer 602 be provided also on the LTSS layer 601 side. In other words, in bonding the LTSS layer 601 to the supporting substrate 600, it is preferable that one or both of surfaces that are to form a bond be provided with the bonding layer 602, so that bonding strength can be increased.

Figure 13A:
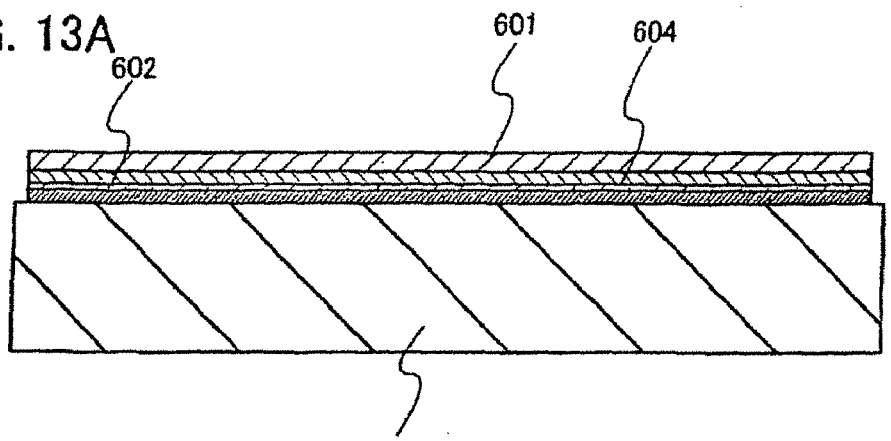
FIGS. 13A to 13C are cross-sectional views each showing an SOI substrate according to an aspect of the present invention.

FIG. 13A shows a structure in which an insulating layer 604 is provided between an LTSS layer 601 and a bonding layer 602. It is preferable that the insulating layer 604 be an insulating layer including nitrogen. For example, the insulating layer 604 can be formed by using a silicon nitride film, a silicon nitride film including oxygen, or a silicon oxide film including nitrogen, or a stacked film including two or more of them.

For example, as the insulating layer 604, a stacked film can be used which is obtained by stacking a silicon oxide film including nitrogen and a silicon nitride film including oxygen from the LTSS layer 601 side. The bonding layer 602 functions to form a bond with the supporting substrate 600, whereas the insulating layer 604 prevents the LTSS layer 601 from being contaminated by an impurity.

Note that here, a silicon oxide film including nitrogen corresponds to a film which includes more oxygen than nitrogen and includes oxygen, nitrogen, silicon, and hydrogen at concentrations ranging from 55 to 65 at. %, 0.5 to 20 at. %, 25 to 35 a. %, and 0.1 to 15 at. %, respectively. Further, a silicon nitride film including oxygen corresponds to a film which includes more nitrogen than oxygen and includes oxygen, nitrogen, silicon, and hydrogen at concentrations ranging from 5 to 30 at. %, 20 to 50 at. %, 25 to 35 at. %, and 15 to 25 at. %, respectively.

Figure 13B:
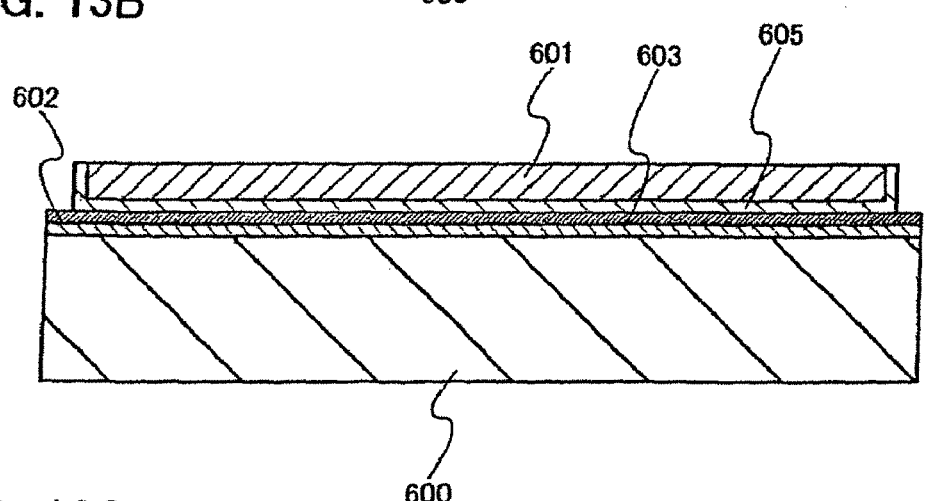

FIG. 13B shows a structure in which a supporting substrate 600 is provided with a bonding layer 602. A barrier layer 603 is preferably provided between the supporting substrate 600 and the bonding layer 602. This is in order to prevent an LTSS layer 601 from being contaminated by a mobile ion impurity like alkali metal or alkaline earth metal that is diffused from a glass substrate which is used as the supporting substrate 600. A silicon oxide layer 605 is formed on the LTSS layer 601 by direct oxidation. This silicon oxide layer 605 forms a bond with the bonding layer 602 and fixes the LTSS layer 601 to the supporting substrate 600. It is preferable that the silicon oxide layer 605 be formed by thermal oxidation.

Figure 13C:
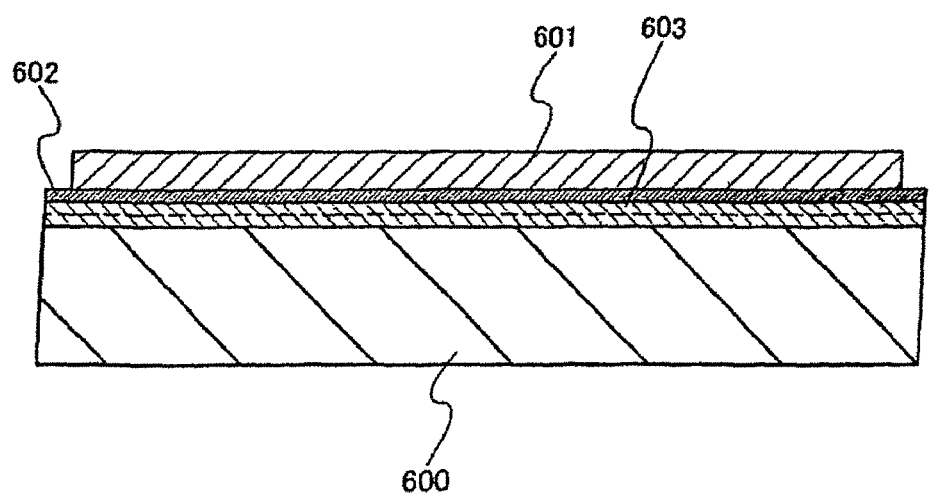

FIG. 13C shows another structure in which a supporting substrate 600 is provided with a bonding layer 602. A barrier layer 603 is provided between the supporting substrate 600 and the bonding layer 602.

In FIG. 13C, the barrier layer 603 is formed of a single layer or a plurality of layers. For example, a silicon nitride film or a silicon nitride film including oxygen which is highly effective in blocking ions of sodium or the like is used as a first layer, and a silicon oxide film or a silicon oxide film including nitrogen is provided thereover as a second layer.

The first layer of the barrier layer 603 is a dense insulating film with a purpose to prevent impurity diffusion, whereas one of purposes of the second layer is to relax stress so that internal stress of the first layer does not affect the upper layer. By providing the barrier layer 603 over the supporting substrate 600 as described above, the range of choices of the substrate in bonding the LTSS layer can be expanded.

The bonding layer 602 is formed over the barrier layer 603 to fix the supporting substrate 600 and the LTSS layer 601.

Methods for manufacturing the substrates having an SOI structure shown in FIGS. 12A and 12B and FIGS. 13A to 13C will be described with reference to FIGS. 14A to 14C, FIGS. 15A and 15B, FIGS. 16A to 16C, FIGS. 17A to 17C, FIGS. 18A and 18B, and FIGS. 19A to 19C.

Figure 14A:
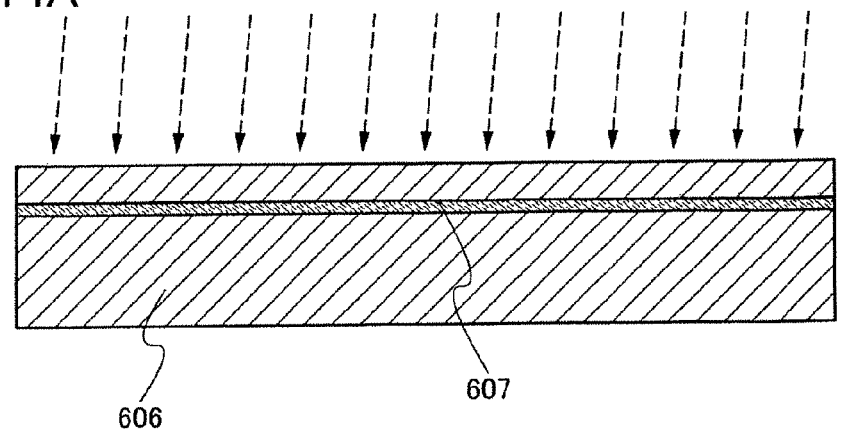
FIGS. 14A to 14C are cross-sectional views showing a manufacturing process of the SOI substrate according to an aspect of the present invention.

Ions that are accelerated by an electric field are implanted into a predetermined depth through a cleaned surface of a semiconductor substrate 606 to form a separation layer 607 (see FIG. 14A). The depth at which the separation layer 607 is formed in the semiconductor substrate 606 is controlled by ion accelerating voltage and an ion incident angle. The separation layer 607 is formed in a region at a depth which is close to the average penetration depth of the ions from the surface of the semiconductor substrate 606. For example, the thickness of an LTSS layer is 5 to 500 nm, preferably 10 to 200 nm, and the accelerating voltage at the time of implanting the ions is determined in consideration of such a thickness. Ion implantation is preferably performed using an ion doping apparatus. In other words, a doping method is used in which a plurality of ion species which are generated from plasma of a source gas are implanted without being mass-separated.

In this embodiment mode, it is preferable that one kind of ions or a plurality of kinds of ions of the same atom with different masses be implanted. Ion doping may be performed with an accelerating voltage of 10 to 100 kV, preferably 30 to 80 kV, at a dose of $1\times10^{16}$ to $4\times10^{16}/cm^2$, and with a beam current density of greater than or equal to 2 μA/cm², preferably greater than or equal to 5 mA/cm², more preferably greater than or equal to 10 μA/cm².

In the case of doping or implantation of hydrogen ions, the hydrogen ions preferably include $H^+$, $H_2^+$, and $H_3^+$ ions with a high proportion of $H_3^+$ ions. In the case of doping or implantation of hydrogen ions, when the hydrogen ions are made to include $H^+$, $H_2^+$, and $H_3^+$ ions with a high proportion of $H_3^+$ ions, implantation efficiency can be increased and doping time can be shortened. Accordingly, the separation layer 607 formed in the semiconductor substrate 606 can include hydrogen at greater than or equal to $1\times10^{20}/cm^3$ (preferably $5\times10^{20}/cm^3$).

When a region doped with hydrogen at a high concentration is locally formed in the semiconductor substrate 606, a crystal structure is disordered and microvoids are formed in the region, whereby the separation layer 607 can be formed. In this case, by heat treatment at relatively low temperature, pressure of a hydrogen gas included in the separation layer 607 is increased, and cleavage occurs along the separation layer 607, which enables a thin LTSS layer to be formed.

Even if ions are implanted into the semiconductor substrate 606 with mass separation being performed, the separation layer 607 can similarly be formed as described above. Also in this case, selective implantation of ions with a large mass (for example, $H_3^+$ ions) is preferable because an effect similar to that described above can be achieved.

As a gas from which ions are generated, deuterium or an inert gas such as helium, as well as hydrogen, can be selected. With the use of helium as a source gas and an ion doping apparatus which does not have a mass separation function, an ion beam with a high proportion of $He^+$ ions can be obtained. By implantation of such ions into the semiconductor substrate 606, microvoids can be formed and the separation layer 607 similar to that described above can be formed in the semiconductor substrate 606.

In formation of the separation layer 607, ions need to be implanted at a high dose, and there are cases where the surface of the semiconductor substrate 606 is roughened. Therefore, a surface, through which ions are implanted, may be provided with a dense film. For example, a protective film against ion implantation, which is formed of a silicon nitride film, a silicon nitride film including oxygen, or the like, may be provided with a thickness of 50 to 200 nm.

Figure 14B:
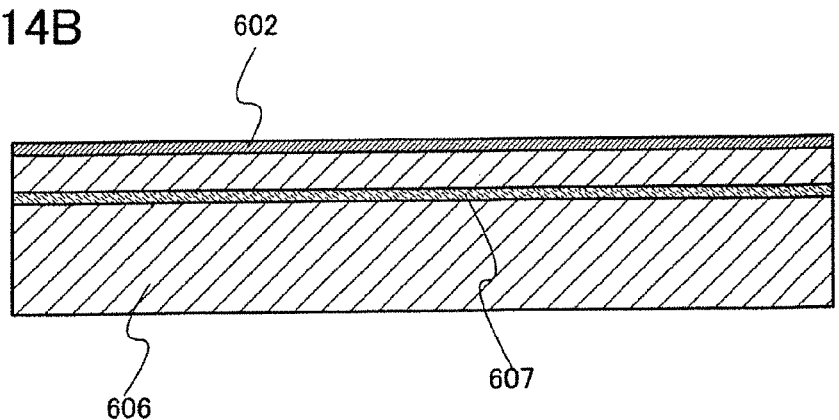

Next, a silicon oxide film is formed as a bonding layer 602 over a surface which is to form a bond with a supporting substrate 600 (see FIG. 14B). The thickness of the silicon oxide film may be 10 to 200 nm, preferably 10 to 100 nm, more preferably 20 to 50 nm.

As the silicon oxide film, a silicon oxide film formed by a chemical vapor deposition method with the use of an organosilane gas as described above is preferable. Alternatively, a silicon oxide film formed by a chemical vapor deposition method with the use of a silane gas can be used. Film formation by a chemical vapor deposition method is performed at a temperature of, for example, less than or equal to 350° C., at which degassing of the separation layer 607 formed in the single crystal semiconductor substrate does not occur. In addition, heat treatment for separation of an LTSS layer from a single crystal or polycrystalline semiconductor substrate is performed at a temperature higher than the film formation temperature.

Figure 14C:
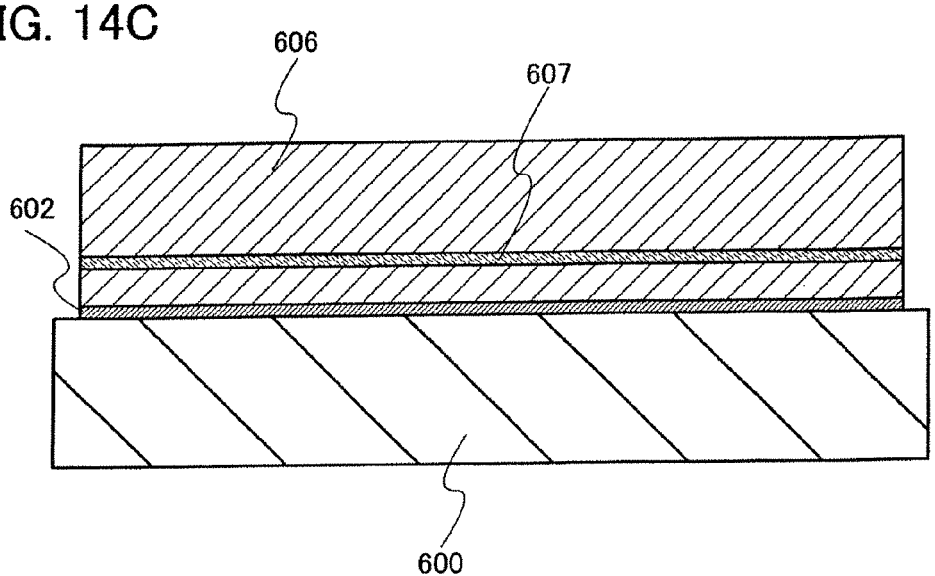

A bond is formed by making a supporting substrate 600 and the surface of the semiconductor substrate 606 where the bonding layer 602 is formed face each other and be in close contact with each other (see FIG. 14C). Surfaces which are to form a bond are cleaned sufficiently, and then, the supporting substrate 600 and the bonding layer 602 are disposed in close contact with each other, whereby a bond is formed. It can be considered that Van der Waals forces act at the early stage of bonding and that a strong bond due to hydrogen bonds can be formed by pressure bonding of the supporting substrate 600 and the semiconductor substrate 606.

In order to form a favorable bond, a surface may be activated. For example, the surface which is to form a bond is irradiated with an atomic beam or an ion beam. When an atomic beam or an ion beam is used, an inert gas neutral atom beam or an inert gas ion beam of argon or the like can be used. Alternatively, plasma irradiation or radical treatment is performed. Such surface treatment makes it possible to increase bonding strength between different kinds of materials even at temperatures of 200 to 400° C.

First heat treatment is performed in a state in which the semiconductor substrate 606 and the supporting substrate 600 are superposed on each other. By the first heat treatment, separation of the semiconductor substrate 606 is performed with a thin semiconductor layer (an LTSS layer) left over the supporting substrate 600 (see FIG. 15A). The first heat treatment is preferably performed at a temperature of greater than or equal to the temperature at which the bonding layer 602 is formed, preferably at a temperature of greater than or equal to 400° C. and less than 700° C. Through the heat treatment performed within this temperature range, pressure of a hydrogen gas included in the separation layer 607 is increased, which enables a semiconductor layer to be cleaved along the separation layer 607. Since the bonding layer 602 is bonded to the supporting substrate 600, an LTSS layer 601 having the same crystallinity as that of the semiconductor substrate 606 is fixed to the supporting substrate 600 in this mode.

Alternatively, before the first heat treatment, thermal activation may be performed at a temperature of lower than 400° C. to strengthen the bond. Specifically, heat treatment may be performed at 200° C. for 1 to 120 minutes.

Figure 15A:
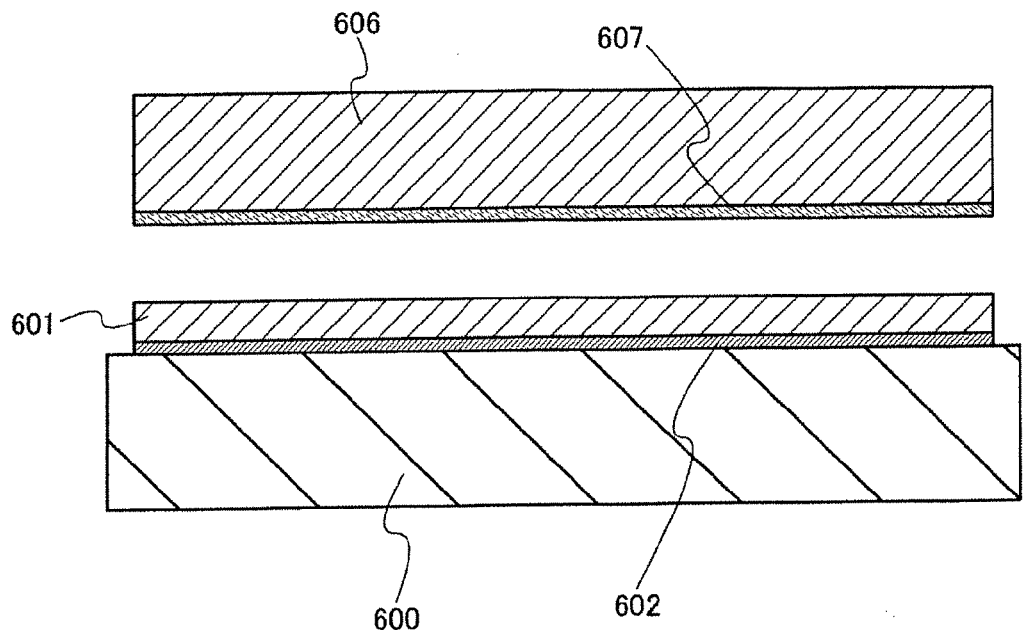
FIGS. 15A and 15B are cross-sectional views showing the manufacturing process of the SOI substrate according to an aspect of the present invention.
Figure 15B:
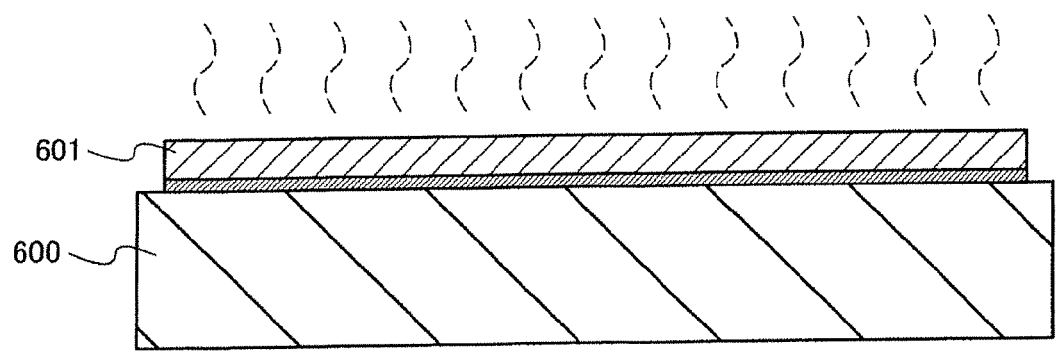

Next, second heat treatment is performed in a state in which the LTSS layer 601 is bonded to the supporting substrate 600 (see FIG. 15B). It is preferable that the second heat treatment be performed at a temperature higher than the temperature of the first heat treatment and lower than the strain point of the supporting substrate 600. Alternatively, even if the first heat treatment and the second heat treatment are performed at the same temperature, it is preferable that the second heat treatment be performed for a longer period of treatment time. The heat treatment may be performed so that the supporting substrate 600 and/or the LTSS layer 601 are/is heated by thermal conduction heating, convection heating, radiation heating, or the like. As a heat treatment apparatus, an electrically heated oven, a lamp annealing furnace, or the like can be used. The second heat treatment may be performed with multilevel changes of temperatures. Alternatively, a rapid thermal annealing (RTA) apparatus may be used. When the heat treatment is performed using an RTA apparatus, heating up to near a substrate strain point or a slightly higher temperature than the substrate strain point is also possible.

The second heat treatment is effective in recovering the crystallinity of the LTSS layer 601 which is impaired by ion doping. Further, the second heat treatment is also effective in recovering damage of the LTSS layer 601 which is caused when the semiconductor substrate 606 is bonded to the supporting substrate 600 and then divided by the first heat treatment. Moreover, by the first heat treatment and the second heat treatment, hydrogen bonds can be changed into stronger covalent bonds.

After that, laser irradiation is preferably performed. By laser irradiation, at least a part of the LTSS layer 601 is melted and recrystallized, and thus a crystal defect is repaired.

For the purpose of planarizing the surface of the LTSS layer 601, a chemical mechanical polishing (CMP) process may be performed. The CMP process can be performed after the first heat treatment or the second heat treatment. Note that when the CMP process is performed before the second heat treatment, it is possible to recover a damaged layer on the surface caused due to the CMP process by the second heat treatment as well as to planarize the surface of the LTSS layer 601.

In any event, by the first heat treatment and the second heat treatment performed in combination as described in this embodiment mode, a crystalline semiconductor layer with excellent crystallinity can be provided over a supporting substrate which is weak against heat such as a glass substrate.

Through the steps of FIGS. 14A to 14C and FIGS. 15A and 15B, the SOI substrate shown in FIG. 12A is formed.

A method for forming the substrate having an SOI structure shown in FIG. 12B will be described with reference to FIGS. 18A and 18B.

Based on the manufacturing steps shown in FIGS. 14A and 14B, a separation layer 607 is formed in a semiconductor substrate 606, and a bonding layer 602 is formed over a surface of the semiconductor substrate 606 which is to form a bond with a supporting substrate 600.

Figure 18A:
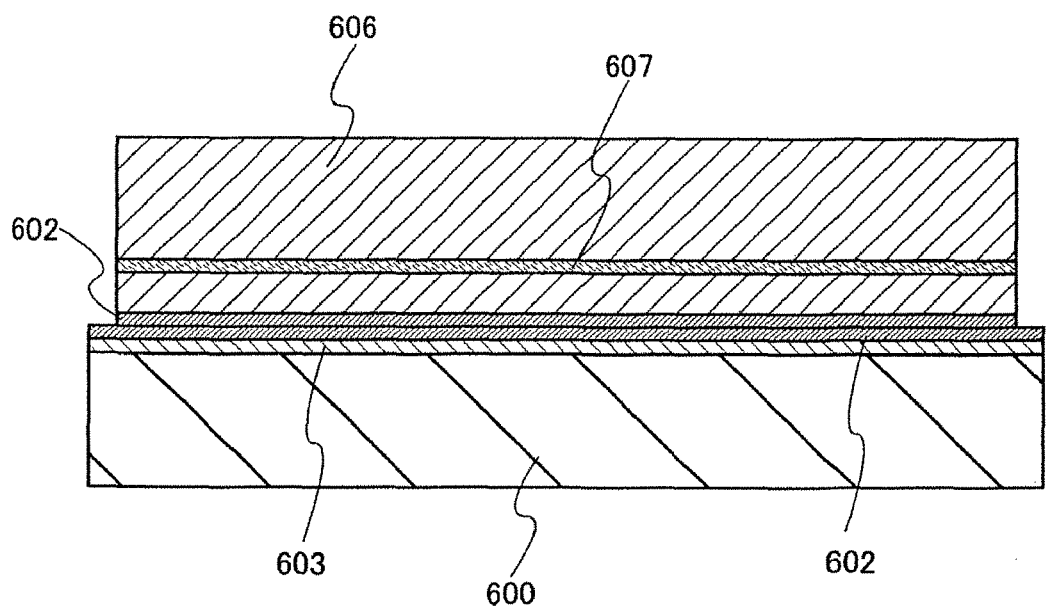
FIGS. 18A and 18B are cross-sectional views showing a manufacturing process of the SOI substrate according to an aspect of the present invention.
Figure 18B:
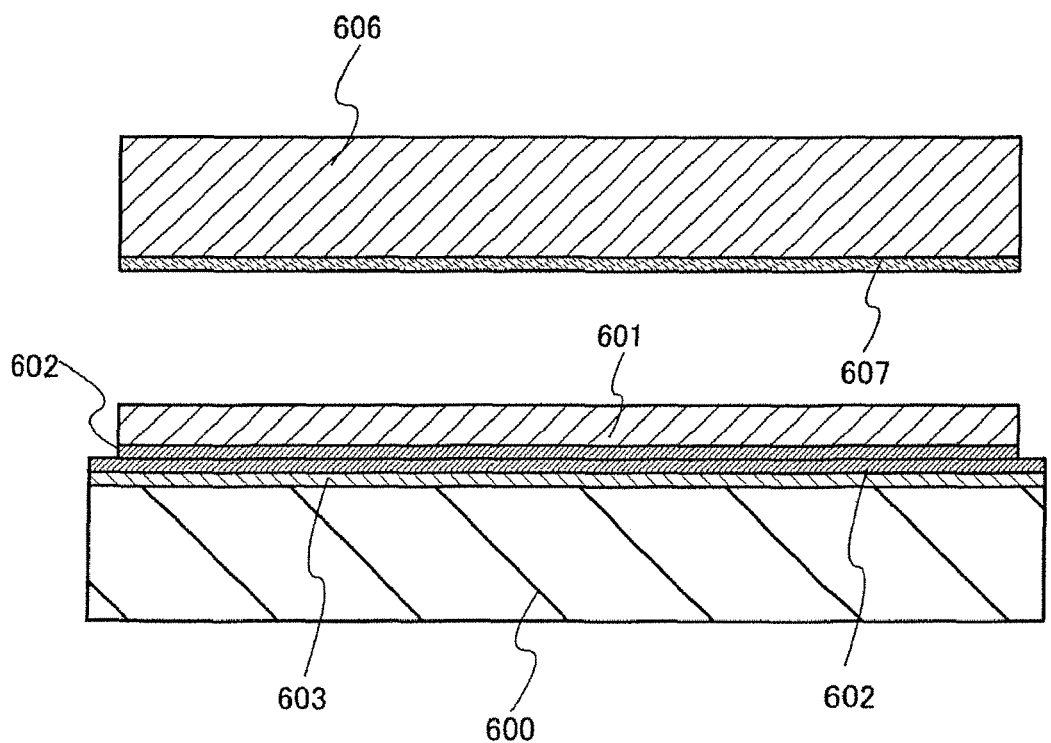

Next, the supporting substrate 600 provided with a barrier layer 603 and a bonding layer 602 is disposed in close contact with the bonding layer 602 of the semiconductor substrate 606 to form a bond (see FIG. 18A).

In this state, first heat treatment is performed. The first heat treatment is preferably performed at a temperature of greater than or equal to the temperature at which the bonding layer 602 is formed, preferably at a temperature of greater than or equal to 400° C. and less than 700° C. Accordingly, pressure of a hydrogen gas included in the separation layer 607 is increased, which enables cleavage in the semiconductor substrate 606. An LTSS layer 601 having the same crystallinity as that of the semiconductor substrate 606 is formed over the supporting substrate 600 (see FIG. 18B).

Alternatively, before the first heat treatment, thermal activation may be performed at a temperature of lower than 400° C. to strengthen the bond. Specifically, heat treatment may be performed at 200° C. for 1 to 120 minutes.

Next, second heat treatment is performed in a state in which the LTSS layer 601 is bonded to the supporting substrate 600. It is preferable that the second heat treatment be performed at a temperature higher than the temperature of the first heat treatment and lower than the strain point of the supporting substrate 600. Alternatively, even if the first heat treatment and the second heat treatment are performed at the same temperature, it is preferable that the second heat treatment be performed for a longer period of treatment time. The heat treatment may be performed so that the supporting substrate 600 and/or the LTSS layer 601 are/is heated by thermal conduction heating, convection heating, radiation heating, or the like. Through the second heat treatment, residual stress of the LTSS layer 601 can be relaxed, and the second heat treatment is also effective in recovering the damage of the LTSS layer 601 caused by division through the first heat treatment.

After that, laser irradiation is preferably performed. By laser irradiation, at least a part of the LTSS layer 601 is melted and recrystallized, and thus a crystal defect is repaired.

In the above-described manner, the SOI substrate shown in FIG. 12B is formed.

Next, a method for manufacturing the substrate having an SOI structure shown in FIG. 13A will be described with reference to FIGS. 19A to 19C.

First, according to the manufacturing step shown in FIG. 14A, a separation layer 607 is formed in a semiconductor substrate 606.

Next, an insulating layer 604 is formed over the surface of the semiconductor substrate 606. It is preferable that the insulating layer 604 be an insulating layer including nitrogen. For example, the insulating layer 604 can be formed using a silicon nitride film, a silicon nitride film including oxygen, or a silicon oxide film including nitrogen, or a stacked film including two or more of them.

Figure 19A:
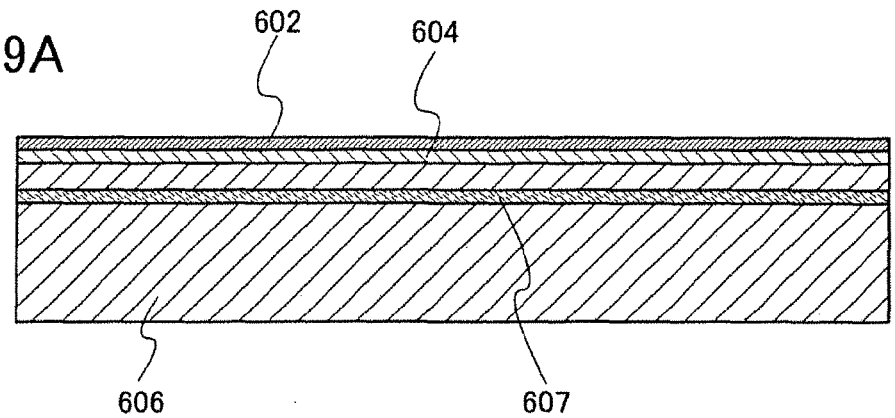
FIGS. 19A to 19C are cross-sectional views showing a manufacturing process of the SOI substrate according to an aspect of the present invention.

Furthermore, a silicon oxide film is formed as a bonding layer 602 over the insulating layer 604 (see FIG. 19A).

Figure 19B:
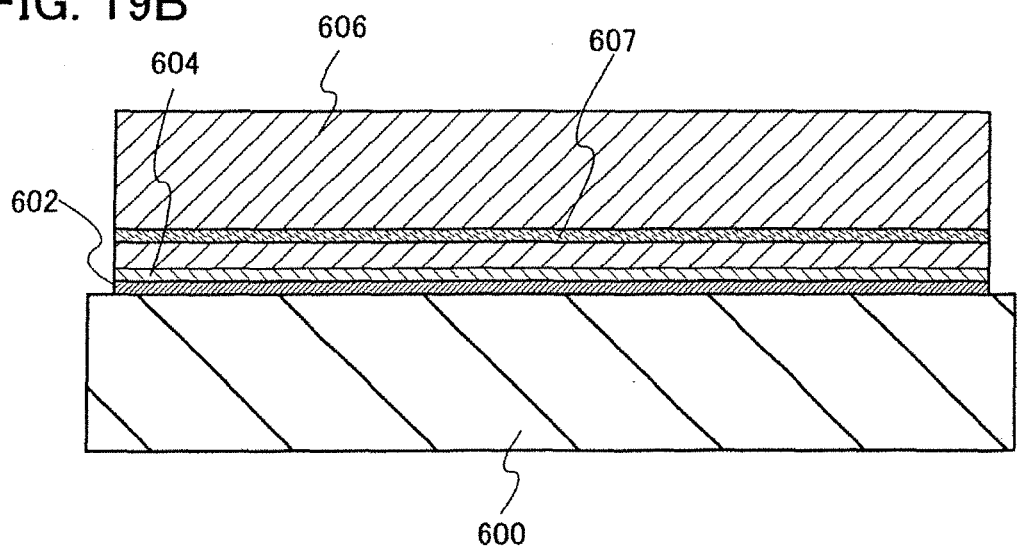

A bond is formed by making a supporting substrate 600 and the surface of the semiconductor substrate 606 where the bonding layer 602 is formed face each other and be in close contact with each other (see FIG. 19B).

In this state, first heat treatment is performed. The first heat treatment is preferably performed at a temperature of greater than or equal to the temperature at which the bonding layer 602 is formed, preferably at a temperature of greater than or equal to 400° C. and less than 700° C. Accordingly, pressure of a hydrogen gas included in the separation layer 607 is increased, which enables cleavage in the semiconductor substrate 606. An LTSS layer 601 having the same crystallinity as that of the semiconductor substrate 606 is formed over the supporting substrate 600 (see FIG. 19C).

Alternatively, before the first heat treatment, thermal activation may be performed at a temperature of lower than 400° C. to strengthen the bond. Specifically, heat treatment may be performed at 200° C. for 1 to 120 minutes.

Next, second heat treatment is performed in a state in which the LTSS layer 601 is bonded to the supporting substrate 600. It is preferable that the second heat treatment be performed at a temperature higher than the temperature of the first heat treatment and lower than the strain point of the supporting substrate 600. Alternatively, even if the first heat treatment and the second heat treatment are performed at the same temperature, it is preferable that the second heat treatment be performed for a longer period of treatment time. The heat treatment may be performed so that the supporting substrate 600 and/or the LTSS layer 601 are/is heated by thermal conduction heating, convection heating, radiation heating, or the like. Through the second heat treatment, residual stress of the LTSS layer 601 can be relaxed, and the second heat treatment is also effective in recovering the damage of the LTSS layer 601 caused by division through the first heat treatment.

After that, laser irradiation is preferably performed. By laser irradiation, at least a part of the LTSS layer 601 is melted and recrystallized, and thus a crystal defect is repaired.

Figure 19C:
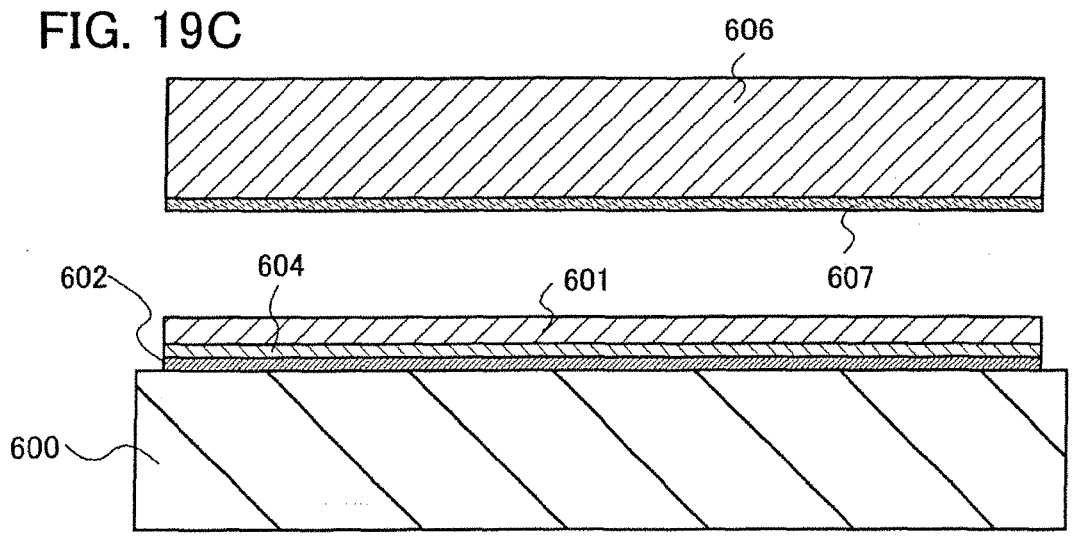

When the insulating layer 604 is formed over the semiconductor substrate 606 as shown in FIGS. 19A to 19C, the insulating layer 604 prevents an impurity from being mixed into the LTSS layer 601; accordingly, the LTSS layer 601 can be prevented from being contaminated.

Figure 16A:
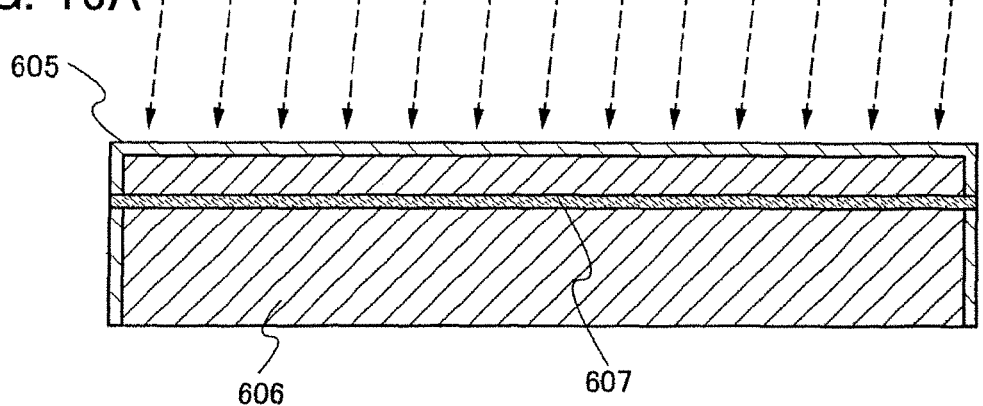
FIGS. 16A to 16C are cross-sectional views showing a manufacturing process of the SOI substrate according to an aspect of the present invention.
Figure 16B:
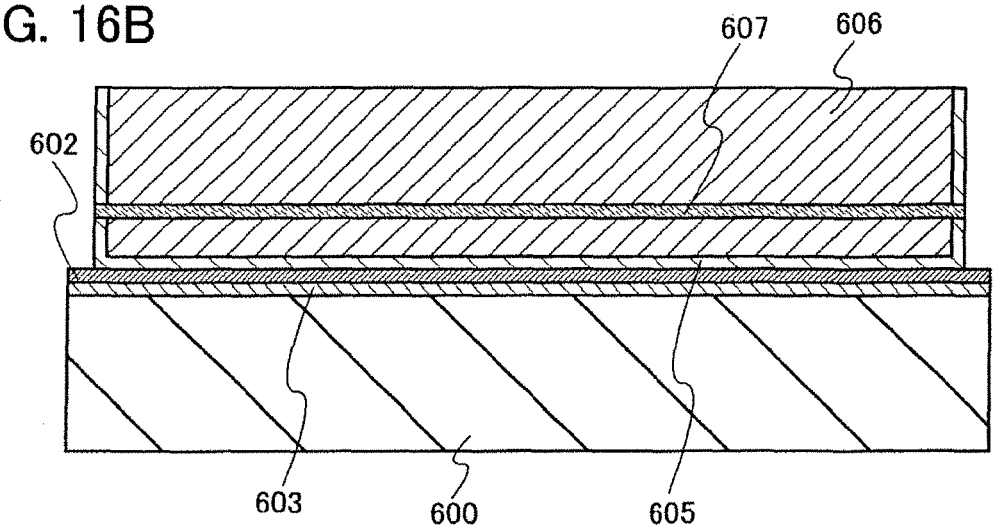
Figure 16C:
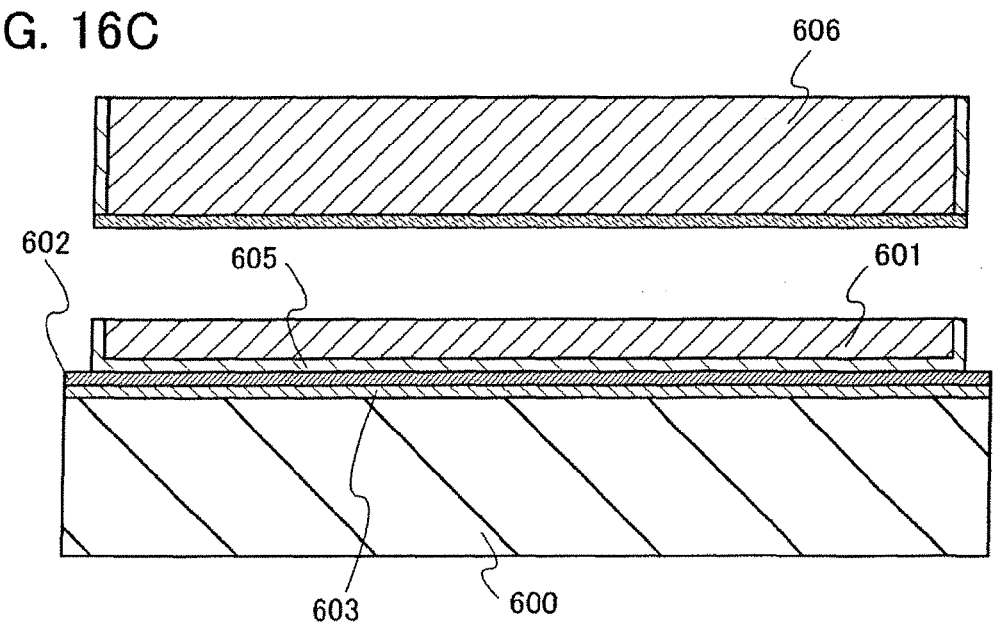

FIGS. 16A to 16C show steps of providing a bonding layer on a supporting substrate side and manufacturing a substrate having an SOI structure provided with an LTSS layer.

First, ions that are accelerated by an electric field are implanted into a semiconductor substrate 606, over which a silicon oxide layer 605 is formed, to a predetermined depth; therefore, a separation layer 607 is formed (see FIG. 16A). The silicon oxide layer 605 may be formed over the semiconductor substrate 606 by a sputtering method or a CVD method, or when the semiconductor substrate 606 is a single crystal silicon substrate, the silicon oxide layer 605 may be formed by thermal oxidation of the semiconductor substrate 606. In this embodiment mode, the semiconductor substrate 606 is a single crystal silicon substrate, and the silicon oxide layer 605 is formed by thermal oxidation of the single crystal silicon substrate.

The implantation of ions into the semiconductor substrate 606 is performed in a manner similar to the case of FIG. 14A. By formation of the silicon oxide layer 605 over the surface of the semiconductor substrate 606, the surface can be prevented from being damaged by ion implantation and losing its planarity.

A supporting substrate 600 provided with a barrier layer 603 and a bonding layer 602 is disposed in close contact with the surface of the semiconductor substrate 606 where the silicon oxide layer 605 is formed to form a bond (see FIG. 16B).

In this state, first heat treatment is performed. The first heat treatment is preferably performed at a temperature of greater than or equal to the temperature at which the bonding layer 602 is formed, preferably at a temperature of greater than or equal to 400° C. and less than 700° C. Accordingly, pressure of a hydrogen gas included in the separation layer 607 is increased, which enables cleavage in the semiconductor substrate 606. An LTSS layer 601 having the same crystallinity as that of the semiconductor substrate 606 is formed over the supporting substrate 600 (see FIG. 16C).

Alternatively, before the first heat treatment, thermal activation may be performed at a temperature of lower than 400° C. to strengthen the bond. Specifically, heat treatment may be performed at 200° C. for 1 to 120 minutes.

Next, second heat treatment is performed in a state in which the LTSS layer 601 is bonded to the supporting substrate 600. It is preferable that the second heat treatment be performed at a temperature higher than the temperature of the first heat treatment and lower than the strain point of the supporting substrate 600. Alternatively, even if the first heat treatment and the second heat treatment are performed at the same temperature, it is preferable that the second heat treatment be performed for a longer period of treatment time. The heat treatment may be performed so that the supporting substrate 600 and/or the LTSS layer 601 are/is heated by thermal conduction heating, convection heating, radiation heating, or the like. Through the second heat treatment, residual stress of the LTSS layer 601 can be relaxed, and the second heat treatment is also effective in recovering the damage of the LTSS layer 601 caused by division through the first heat treatment.

After that, laser irradiation is preferably performed. By laser irradiation, at least a part of the LTSS layer 601 is melted and recrystallized, and thus a crystal defect is repaired.

In the above-described manner, the SOI substrate shown in FIG. 13B is formed.

Figure 17A:
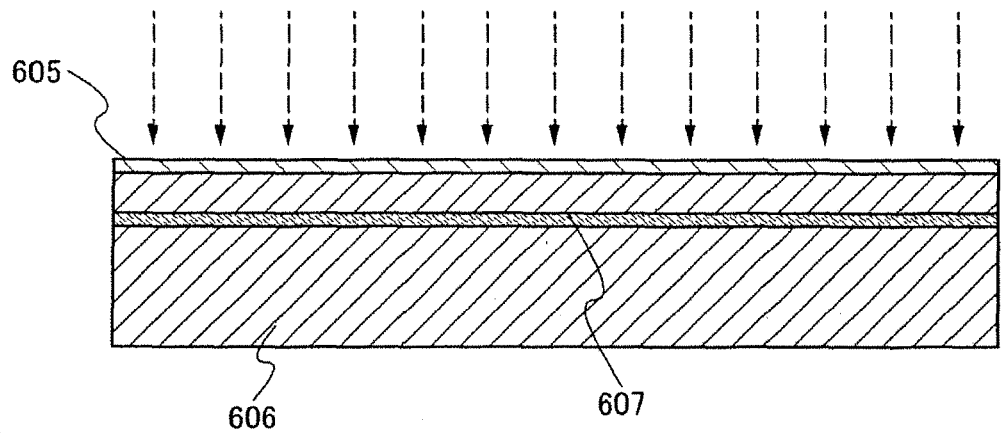
FIGS. 17A to 17C are cross-sectional views showing a manufacturing process of the SOI substrate according to an aspect of the present invention.
Figure 17B:
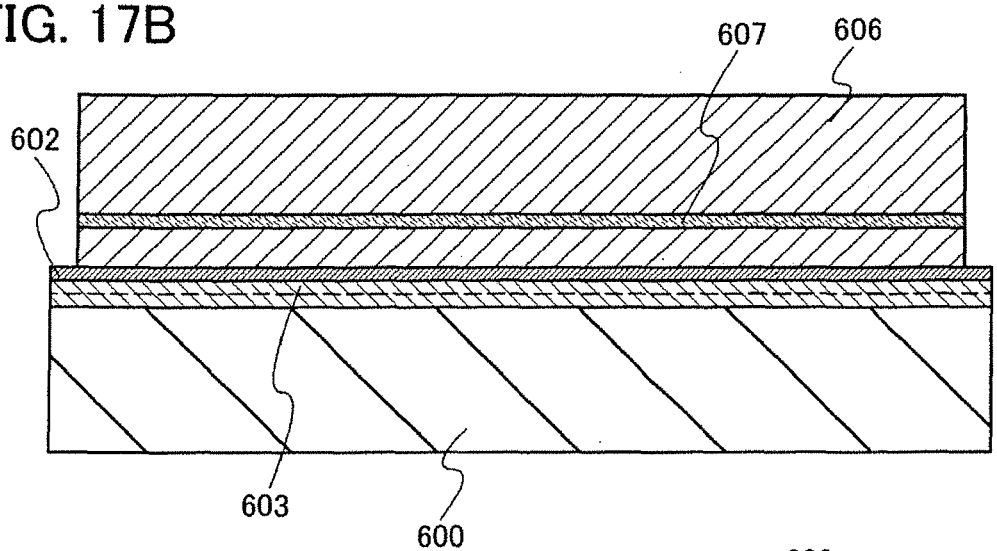
Figure 17C:
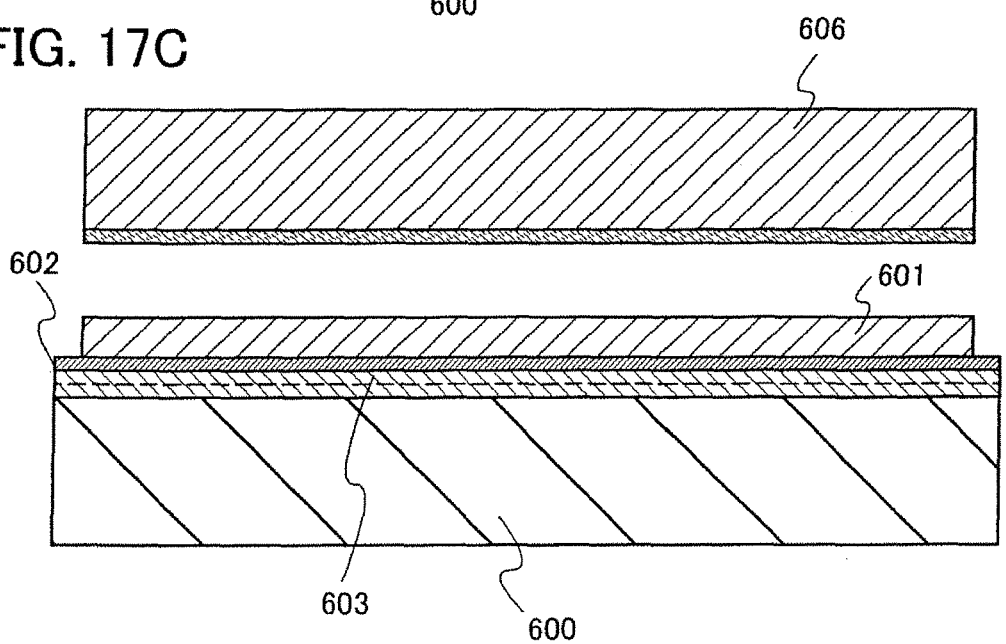

FIGS. 17A to 17C show another example in the case where a bonding layer is provided on a supporting substrate side to bond an LTSS layer.

First, a separation layer 607 is formed in a semiconductor substrate 606 (see FIG. 17A). The implantation of ions for formation of the separation layer 607 is performed using an ion doping apparatus. In this step, ions with different masses are accelerated by a high electric field to irradiate the semiconductor substrate 606.

At this time, it is preferable that a silicon oxide layer 605 be provided as a protective film because the planarity of the surface of the semiconductor substrate 606 might be impaired by ion irradiation. The silicon oxide layer 605 may be formed by thermal oxidation or by using a chemical oxide. A chemical oxide can be formed by immersion of the semiconductor substrate 606 in an oxidizing chemical solution. For example, with treatment of the semiconductor substrate 606 with an aqueous solution including ozone, a chemical oxide is formed on the surface.

Alternatively, as the protective film, a silicon oxide film including nitrogen or a silicon nitride film including oxygen formed by a plasma CVD method, or a silicon oxide film formed using TEOS may be used.

It is preferable that a supporting substrate 600 be provided with a barrier layer 603. By providing the barrier layer 603, an LTSS layer 601 can be prevented from being contaminated by a mobile ion impurity like alkali metal or alkaline earth metal that is diffused from a glass substrate which is used as the supporting substrate 600.

The barrier layer 603 is formed of a single layer or a plurality of layers. For example, a silicon nitride film or a silicon nitride film including oxygen which is highly effective in blocking ions of sodium or the like is used as a first layer, and a silicon oxide film or a silicon oxide film including nitrogen is provided thereover as a second layer.

The first layer of the barrier layer 603 is a dense insulating film with a purpose to prevent impurity diffusion, whereas one of purposes of the second layer is to relax stress so that internal stress of the first layer does not affect the upper layer. By providing the barrier layer 603 over the supporting substrate 600 as described above, the range of choices of the substrate in bonding the LTSS layer can be expanded.

The supporting substrate 600 provided with a bonding layer 602 over the barrier layer 603 and the semiconductor substrate 606 are bonded to each other (see FIG. 17B). At the surface of the semiconductor substrate 606, the silicon oxide layer 605, which has been provided as a protective film, is removed with a hydrofluoric acid to expose the surface of the semiconductor substrate. The outermost surface of the semiconductor substrate 606 may be in a state in which the surface is terminated with hydrogen by treatment with a hydrofluoric acid solution. In formation of the bond, hydrogen bonds are formed by surface-terminating hydrogen, and a favorable bond can be formed.

Furthermore, irradiation with ions of an inert gas may be performed so that dangling bonds are exposed on the outermost surface of the semiconductor substrate 606, and a bond may be formed in vacuum.

In this state, first heat treatment is performed. The first heat treatment is preferably performed at a temperature of greater than or equal to the temperature at which the bonding layer 602 is formed, preferably at a temperature of greater than or equal to 400° C. and less than 700° C. Accordingly, pressure of a hydrogen gas included in the separation layer 607 is increased, which enables cleavage in the semiconductor substrate 606. An LTSS layer 601 having the same crystallinity as that of the semiconductor substrate 606 is formed over the supporting substrate 600 (see FIG. 17C).

Alternatively, before the first heat treatment, thermal activation may be performed at a temperature of lower than 400° C. to strengthen the bond. Specifically, heat treatment may be performed at 200° C. for 1 to 120 minutes.

Next, second heat treatment is performed in a state in which the LTSS layer 601 is bonded to the supporting substrate 600. It is preferable that the second heat treatment be performed at a temperature higher than the temperature of the first heat treatment and lower than the strain point of the supporting substrate 600. Alternatively, even if the first heat treatment and the second heat treatment are performed at the same temperature, it is preferable that the second heat treatment be performed for a longer period of treatment time.

The heat treatment may be performed so that the supporting substrate 600 and/or the LTSS layer 601 are/is heated by thermal conduction heating, convection heating, radiation heating, or the like. Through the second heat treatment, residual stress of the LTSS layer 601 can be relaxed, and the second heat treatment is also effective in recovering the damage of the LTSS layer 601 caused by division through the first heat treatment.

After that, laser irradiation is preferably performed. By laser irradiation, at least a part of the LTSS layer 601 is melted and recrystallized, and thus a crystal defect is repaired.

In the above-described manner, the SOI substrate shown in FIG. 13C is formed.

Then, the crystalline semiconductor film 104 or the LTSS layer 601 is etched using a mask, whereby an island-like semiconductor film 105 is formed (see FIG. 1C).

The island-like semiconductor film 105 is treated with ozone water or a hydrogen peroxide solution, or oxidized by a UV ozone method, so that an oxide film 107 of the island-like semiconductor film is formed on the surface of the island-like semiconductor film 105. The oxide film 107 has a small thickness of 0.2 to 4 nm, preferably 0.5 to 3 nm.

Alternatively, by nitriding the island-like semiconductor film 105, a nitride film can be formed instead of the oxide film 107.

In addition, before formation of the oxide film 107 or the nitride film, a native oxide film on the surface of the island-like semiconductor film 105 may be removed with a dilute hydrofluoric acid.

For example, plasma nitridation treatment is used for nitriding the island-like semiconductor film 105. In the plasma nitridation treatment, an ammonia gas, a nitrogen gas, or a dinitrogen monoxide ($N_2O$) gas is introduced to a reaction chamber in a high-vacuum state, and high-frequency power is applied, whereby plasma is generated. By performing the plasma nitridation treatment to the island-like semiconductor film 105, a very thin nitride film is formed on the surface of the island-like semiconductor film 105. Furthermore, an oxygen gas is mixed into the reaction chamber where the plasma nitridation treatment is performed.

Further, after formation of the oxide film 107 through the above step, nitridation treatment may be performed to nitride the surface of the oxide film, and a nitride film including oxygen may be formed instead of the oxide film 107. A suboxide or a subnitride is included at 10 to 40%, preferably at 30 to 40%.

In this specification, a suboxide means an oxide which is represented by $Si_2O$, $SiO$, or $Si_2O_3$ for convenience, according to a measurement result with X-ray photoelectron spectroscopy (XPS) or electron spectroscopy for chemical analysis (ESCA). Further, for convenience, electric charge of silicon in $Si_2O$, that in $SiO$, and that in $Si_2O_3$ are $Si^{1+}$, $Si^{2+}$, and $Si^{3+}$, respectively. Note that electric charge of silicon in $SiO_2$ is $Si^{4+}$.

The description "a suboxide is included at 10 to 40%" means that oxides which are represented by $Si_2O$, $SiO$, and $Si_2O_3$ account for 10 to 40% of the entire silicon oxides which include $Si_2O$, $SiO$, $Si_2O_3$, and $SiO_2$.

The same applies to a subnitride except that oxygen in a suboxide is replaced with nitrogen.

Even in the case that a nitride film or a nitride film including oxygen is formed instead of the oxide film 107, the thickness thereof is 0.2 to 4 nm, preferably 0.5 to 3 nm.

Further, instead of oxidizing or nitriding the island-like semiconductor film 105, a very thin oxide film of the semiconductor film or a very thin nitride film of the semiconductor film may be formed by a plasma CVD method or the like over the surface of the island-like semiconductor film 105. Also in this case, the film thickness is 0.2 to 4 nm, preferably 0.5 to 3 nm. A suboxide or a subnitride is included at 10 to 40%, preferably at 30 to 40%.

For example, a silicon nitride film including oxygen or a silicon oxide film including nitrogen can be formed very thinly over the surface of the island-like semiconductor film 105 by a plasma CVD method with the use of a mixed gas of monosilane ($SiH_4$) and dinitrogen monoxide ($N_2O$).

The following films are referred to as "a first insulating film" in this specification: the oxide film 107 formed on the surface of the island-like semiconductor film 105 by treating the island-like semiconductor film 105 with ozone water or a hydrogen peroxide solution or by oxidizing the island-like semiconductor film 105 with a UV ozone method, and films which can be formed instead of the oxide film 107, i.e., a very thin nitride film formed on the surface of the island-like semiconductor film 105 by performing plasma nitridation treatment to the island-like semiconductor film 105, a nitride film including oxygen obtained by forming the oxide film 107 and performing nitridation treatment thereto, and a very thin oxide film or a very thin nitride film formed on the surface of the island-like semiconductor film 105 by a CVD method or the like. A suboxide or a subnitride is included at 10 to 40%, preferably at 30 to 40%.

Before formation of the first insulating film, a native oxide film on the surface of the island-like semiconductor film 105 may be removed with a dilute hydrofluoric acid.

After formation of the oxide film 107, a semiconductor film 108 is formed to have a thickness of 10 to 50 nm over the island-like semiconductor film 105 and the oxide film 107 (see FIG. 1D).

The semiconductor film 108 may be any one of an amorphous semiconductor film, a crystalline semiconductor film, and a microcrystalline semiconductor film (also referred to as a semi-amorphous semiconductor film).

Note that a semi-amorphous semiconductor (in this specification, also referred to as "SAS") film is a film including a semiconductor having an intermediate structure between an amorphous semiconductor and a crystalline semiconductor (including a single crystal and a polycrystal). The semi-amorphous semiconductor film is a semiconductor film having a third state that is stable in terms of free energy and is a crystalline semiconductor having a short-range order and lattice distortion, and crystal grains with a diameter of 0.5 to 20 nm can be dispersed in a non-single-crystal semiconductor film. Note that a microcrystalline semiconductor film is also included in the semi-amorphous semiconductor film.

As a semi-amorphous semiconductor film, for example, a semi-amorphous silicon film can be given. A Raman spectrum of the semi-amorphous silicon film is shifted to a lower wave number than 520 $cm^{-1}$. The diffraction peaks of (111) and (220) which are to be derived from a Si crystal lattice are observed by X-ray diffraction. In order to terminate dangling bonds, the semi-amorphous silicon film includes hydrogen or halogen at a rate of at least 1 at. %. In this specification, such a silicon film is referred to as a semi-amorphous silicon film for the sake of convenience. Moreover, the semi-amorphous semiconductor film is made to include a rare gas element such as helium, argon, krypton, or neon to further enhance its lattice distortion, whereby stability is increased and a favorable semi-amorphous semiconductor film can be obtained.

In addition, a semi-amorphous silicon film can be obtained by glow discharge decomposition of a gas including silicon. As a typical gas including silicon, $SiH_4$ is given, and $Si_2H_6$, $SiH_2Cl_2$, $SiHCl_3$, $SiCl_4$, $SiF_4$, or the like can also be used. The gas including silicon is diluted with hydrogen or a gas in which one or more of rare gas elements selected from helium, argon, krypton, and neon are added to hydrogen; therefore, the semi-amorphous silicon film can easily be formed. It is preferable that the gas including silicon be diluted to be 2 to 1000 times thinner. Moreover, a carbide gas such as $CH_4$ or $C_2H_6$, a germanium gas such as $GeH_4$ or $GeF_4$, $F_2$, or the like may be mixed into the gas including silicon so as to adjust the energy band width within the range of 1.5 to 2.4 eV or 0.9 to 1.1 eV.

In this embodiment mode, a semiconductor film whose main component is silicon such as an amorphous silicon film is used for the semiconductor film 108. A semiconductor film whose main component is germanium may also be used. Examples of the semiconductor film whose main component is silicon or germanium are a silicon film, a germanium film, and a silicon-germanium film.

In addition, in this embodiment mode, the semiconductor film 108 is formed using an amorphous silicon film to which an impurity element imparting one conductivity type is not added, which is a so-called intrinsic amorphous silicon film or an i-type amorphous silicon film but is not limited thereto. The semiconductor film 108 may also be formed using a semiconductor film to which an impurity element imparting n-type conductivity such as phosphorus (P) or arsenic (As) is added, which is a so-called n-type semiconductor film; or a semiconductor film to which an impurity element imparting p-type conductivity such as boron (B) is added, which is a so-called p-type semiconductor film.

Then, the semiconductor film 108 is etched, and semiconductor films 109 (a semiconductor film 109a and a semiconductor film 109b) are formed in regions which are near end portions of the island-like semiconductor film 105 (see FIG. 1E). In etching the semiconductor film 108, the oxide film 107 serves as an etching stopper and prevents the island-like semiconductor film 105 from being etched. If the oxide film 107 is not formed, the island-like semiconductor film 105 could possibly be etched and have a depressed portion in etching the semiconductor film 108. The semiconductor film 108 may be etched by dry etching or wet etching.

In this embodiment mode, the semiconductor film 108 is etched by wet etching using an alkaline solution. Tetramethylammonium hydroxide (TMAH) or potassium hydroxide is used for the alkaline solution and heated at 50 to 70° C. to be used in wet etching.

Next, the island-like semiconductor film 105 is oxidized to obtain a new oxide film, which is referred to as "a second insulating film" in this specification. The second insulating film and the oxide film 107 (the first insulating film) collectively form a gate insulating film 115. Before oxidation of the island-like semiconductor film 105, the oxide film 107 (the first insulating film) may be removed. In that case, the new oxide film (the second insulating film) obtained by oxidizing the island-like semiconductor film 105 is used as a gate insulating film (described later with FIGS. 23A to 23E). Note that an oxide film is also formed on each of the semiconductor films 109 practically, although not shown in FIG. 1F and so on.

Then, in a region which is over the island-like semiconductor film 105 and the oxide film 107 and where the semiconductor films 109 are not formed, a gate electrode 111 is formed (see FIG. 1F).

The gate electrode 111 can be formed using any one of chromium (Cr), tantalum (Ta), tungsten (W), titanium (Ti), aluminum (Al), and tantalum nitride, or a stacked film including two or more of them.

An impurity element imparting one conductivity type is added to the semiconductor films 109 using the gate electrode 111 as a mask. As an impurity element imparting n-type conductivity, for example, phosphorus (P) or arsenic (As) may be used. In addition, as an impurity element imparting p-type conductivity, for example, boron (B) may be used.

The impurity element imparting one conductivity type is added by an ion doping method or an ion implantation method at an accelerating voltage (also referred to as an application voltage) of 5 to 80 kV. In this addition step, ions collided with oxygen, silicon, or the like included in the very thin oxide film 107 of the semiconductor film, which is a very thin silicon oxide film in this embodiment mode, and oxygen or silicon scatters or jumps, that is, ion mixing occurs. The impurity element imparting one conductivity type is added at a concentration in the range of $1\times10^{14}$ to $1\times10^{16}$ atoms/cm$^2$, and may also be added twice or more at different accelerating voltage.

Through the step of adding the impurity element, a channel formation region 118 is formed in a region which is in the island-like semiconductor film 105 and below the gate electrode 111. Regions which are in the island-like semiconductor film 105 and to which the impurity element is added and the semiconductor films 109 become impurity regions 114 (an impurity region 114a and an impurity region 114b). The very thin oxide films 107 in the impurity regions 114 become oxide films 116 (an oxide film 116a and an oxide film 116b) in which ion mixing has, occurred (see FIG. 1G).

After that, the impurity element which is added is activated with laser activation, rapid thermal annealing (RTA), annealing using a furnace, or the like. In particular, when the temperature of the island-like semiconductor film 105 and the semiconductor films 109 becomes greater than or equal to 700° C., particularly greater than or equal to 1000° C. with laser activation or RTA, oxygen is more diffused and the oxide films 116 in which ion mixing has occurred disappear at least partly. In addition, when the oxide films 116 and the semiconductor film in the periphery thereof are melted in laser activation, the oxide films 116 are likely to disappear. At the same time, crystal growth, that is, epitaxial growth of the semiconductor films 109 progresses in accordance with a crystal condition of the island-like semiconductor film 105. Accordingly, the semiconductor films 109 come to have n-type or p-type conductivity and lower resistance and become n-type or p-type crystalline semiconductor films. Laser activation or RTA which is a short-time treatment can prevent the glass substrate from being melted or deformed to a large degree.

In the above manner, the channel formation region 118, a region 119a which is one of a source region and a drain region, and a region 119b which is the other of the source region and the drain region are formed (see FIG. 1H).

Further, as described above, the oxide film 107 (the first insulating film) may be removed before the island-like semiconductor film 105 is oxidized, and the new oxide film (the second insulating film) obtained by oxidizing the island-like semiconductor film 105 may be used as a gate insulating film. This case will be described with reference to FIGS. 23A to 23E. Note that the same parts as in FIGS. 1A to 1H are denoted by the same reference numerals.

Figure 23A:
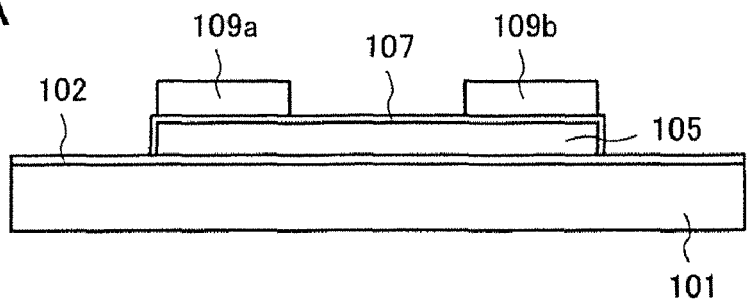
FIGS. 23A to 23E are cross-sectional views showing a manufacturing process of a semiconductor device according to an aspect of the present invention.

First, through the manufacturing steps in FIGS. 1A to 1E, a structure shown in FIG. 23A is obtained. FIG. 23A shows the same structure as in FIG. 1E.

Figure 23B:
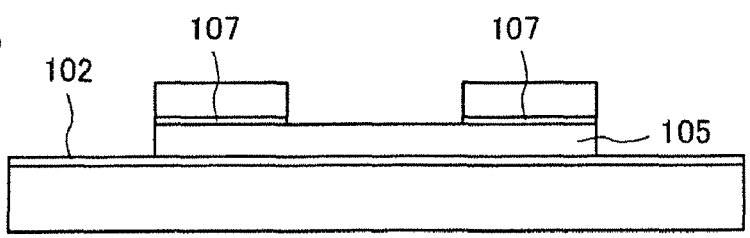
Figure 23C:
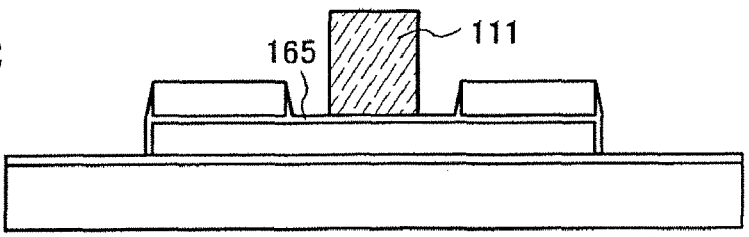

Then, the oxide film 107 in a region which is not interposed between the island-like semiconductor film 105 and the semiconductor films 109, that is, an exposed region of the oxide film 107 is removed, so that the island-like semiconductor film 105 in a region where the semiconductor films 109 (109a and 109b) are not formed is exposed (see FIG. 23B).

Next, by oxidation or nitridation of the island-like semiconductor film 105, an oxide film, an oxide film including nitrogen, a nitride film including oxygen, or a nitride film is newly obtained. In this embodiment mode, an oxide film 165 is obtained. Note that an oxide film is also formed on each of the semiconductor films 109 practically, although not shown in FIG. 23C and so on. The oxide film 165 functions as a gate insulating film. A gate electrode 111 is formed over the oxide film 165 which is a gate insulating film (see FIG. 23C).

Figure 23D:
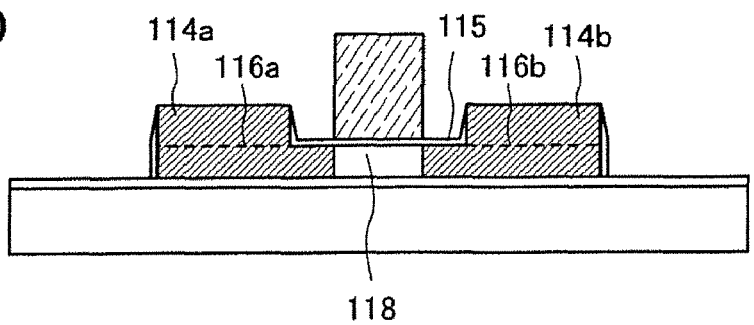
Figure 23E:
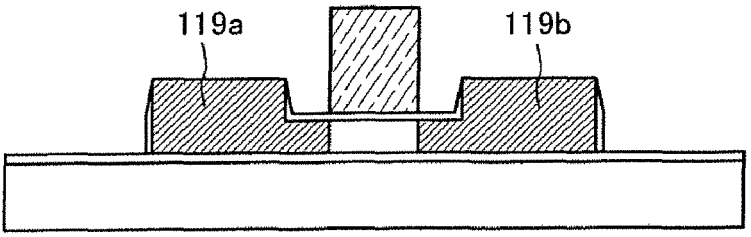

A step of adding an impurity element, a heating step, and the like are performed according to the manufacturing steps in FIGS. 1G and 1H (see FIGS. 23D to 23E).

In addition, a second gate insulating film 166 may be formed over the gate insulating film 115 in FIG. 1H. A manufacturing process in the case that the second gate insulating film 166 is formed will be described with reference to FIGS. 10A to 10E.

First, the steps up to formation of semiconductor films 109 (109a and 109b) in FIG. 1E are carried out, and then, the island-like semiconductor film 105 is oxidized, and the new oxide film (also referred to as the second insulating film in this specification) is formed. The second insulating film and the oxide film 107 (the first insulating film) collectively form an oxide film 117. Note that an oxide film is also formed on each of the semiconductor films 109 practically, although not shown in FIG. 10A and so on. An insulating film 110 (also referred to as a third insulating film in this specification) is formed so as to cover the island-like semiconductor film 105, the semiconductor films 109a and 109b, and the oxide film 117 (see FIG. 10B).

Figure 10A:
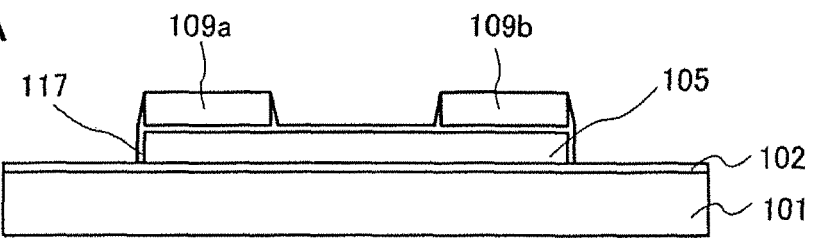
FIGS. 10A to 10E are cross-sectional views showing a manufacturing process of a semiconductor device according to an aspect of the present invention.
Figure 10B:
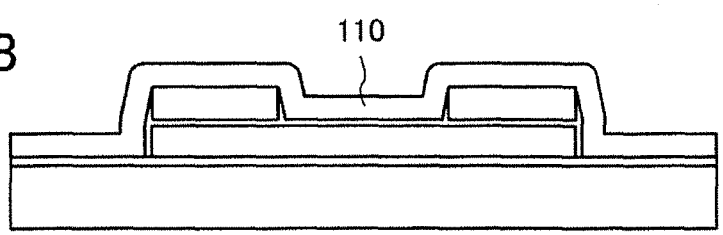
Figure 10C:
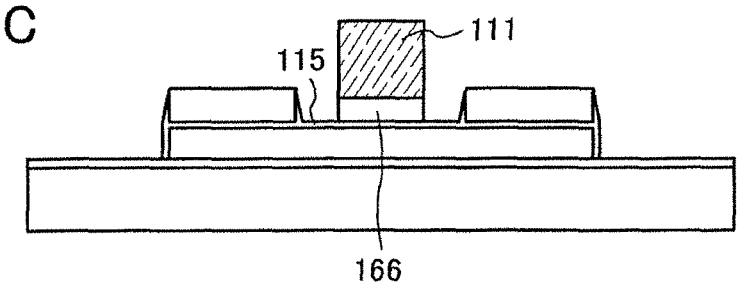

A gate electrode 111 is formed over the insulating film 110, and the insulating film 110 is etched using the gate electrode 111 as a mask, whereby the second gate insulating film 166 is formed over the first gate insulating film 115 (see FIG. 10C).

The second gate insulating film 166 may be formed using any one of a silicon oxide film, a silicon oxide film including nitrogen, a silicon nitride film, and a silicon nitride film including oxygen, or a stacked film including two or more of them.

Figure 10D:
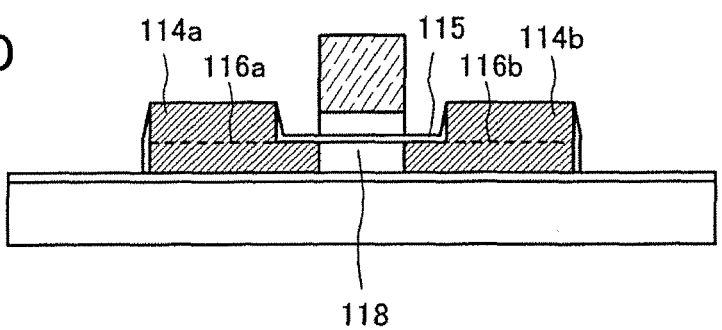
Figure 10E:
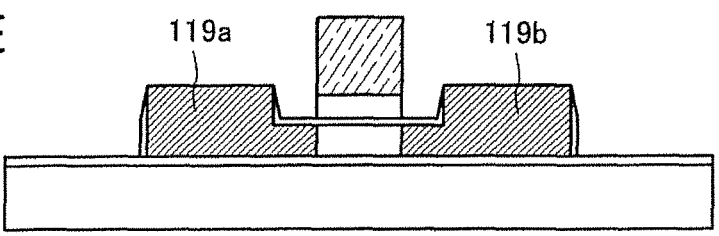

After that, a thin film transistor is manufactured according to the manufacturing steps in FIGS. 1G and 1H (see FIGS. 10D and 10E).

After formation of the semiconductor films 109 (109a and 109b), the oxide film 107 in a region which is not interposed between the island-like semiconductor film 105 and the semiconductor films 109, that is, an exposed region of the oxide film 107 is removed, so that the island-like semiconductor film 105 in a region where the semiconductor films 109 (109a and 109b) are not formed is exposed. Then, a new gate insulating film 151 may be formed over an exposed region of the island-like semiconductor film 105. The steps of removing the exposed region of the oxide film 107, exposing the island-like semiconductor film 105 in the region where the semiconductor films 109 (109a and 109b) are not formed, and forming the gate insulating film 151 will be described with reference to FIGS. 11A to 11F.

A nitride film or a nitride film including oxygen may also be used instead of the oxide film 107 as described above.

Figure 11A:
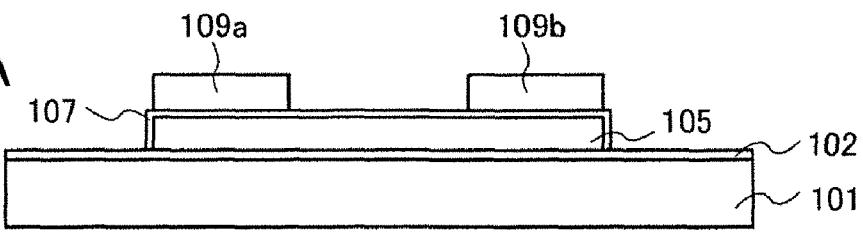
FIGS. 11A to 11F are cross-sectional views showing a manufacturing process of a semiconductor device according to an aspect of the present invention.
Figure 11B:
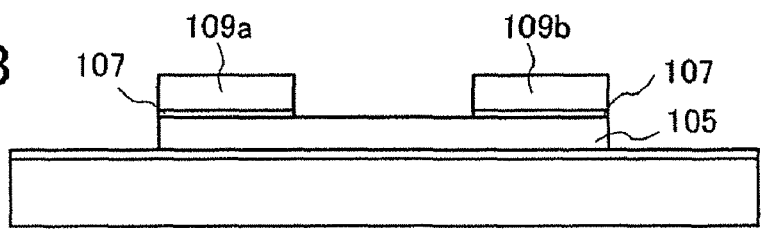

First, the steps up to formation of semiconductor films 109 (109a and 109b) are carried out according to FIGS. 1A to 1E (see FIG. 11A). Then, an oxide film 107 (or a nitride film or a nitride film including oxygen) which is exposed is removed using the semiconductor films 109 (109a and 109b) as masks. Accordingly, only the oxide films 107 in regions which are interposed between an island-like semiconductor film 105 and the semiconductor films 109 remain (see FIG. 11B).

Figure 11C:
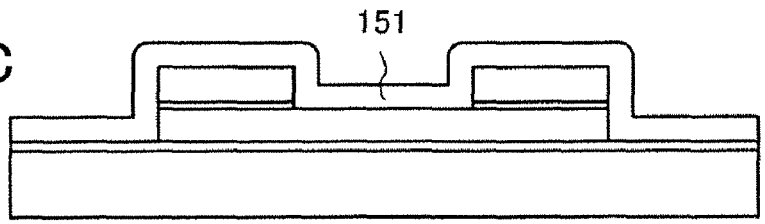

Next, a gate insulating film 151 is formed over the island-like semiconductor film 105 in a region where the oxide film 107 is removed (see FIG. 11C). The gate insulating film 151 may be formed using any one of a silicon oxide film, a silicon oxide film including nitrogen, a silicon nitride film, and a silicon nitride film including oxygen, or a stacked film including two or more of them.

Figure 11D:
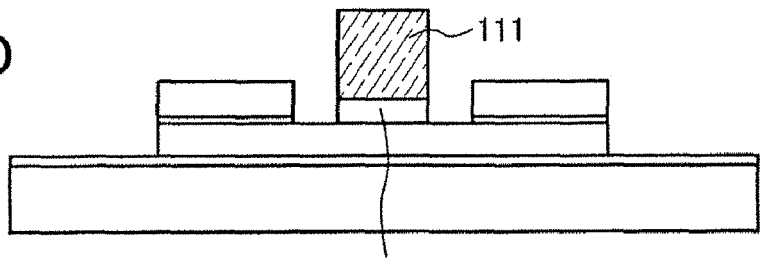
Figure 11E:
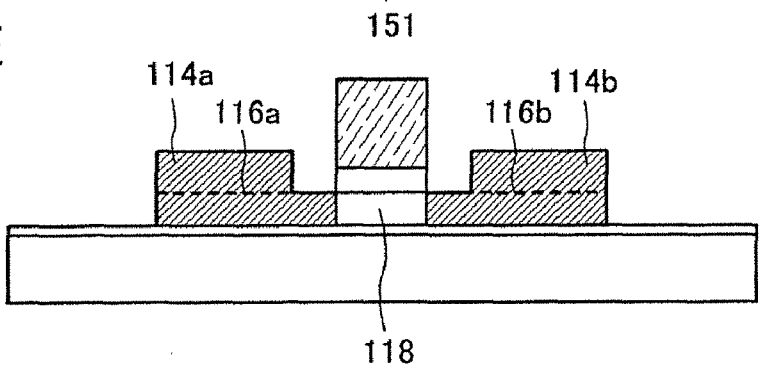
Figure 11F:
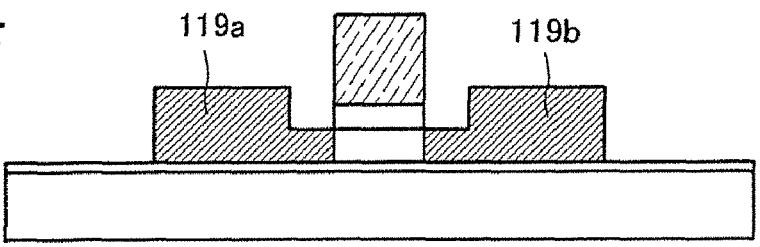

Then, a gate electrode 111 is formed over the gate insulating film 151 (see FIG. 11D). After that, a thin film transistor is manufactured according to the manufacturing steps in FIGS. 1G and 1H (see FIGS. 11E and 11F).

Embodiment Mode 2

In this embodiment mode, a method for manufacturing a thin film transistor having a different structure from those of Embodiment Mode 1 will be described with reference to FIGS. 3A to 3F, FIGS. 4A to 4C, FIGS. 8A to 8E, and FIGS. 9A to 9C.

Figure 3A:
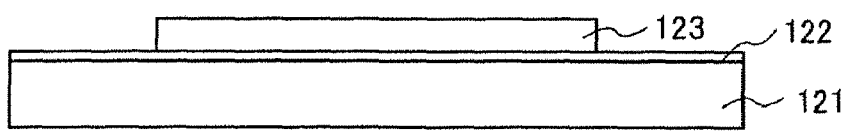
FIGS. 3A to 3F are cross-sectional views showing a manufacturing process of a semiconductor device according to an aspect of the present invention.

Manufacturing steps up to the step shown in FIG. 1C are carried out according to Embodiment Mode 1. FIG. 3A corresponds to FIG. 1C. Further, a substrate 121, a base insulating film 122, and an island-like semiconductor film 123 correspond to the substrate 101, the base insulating film 102, and the island-like semiconductor film 105, respectively.

Then, an insulating film 124 is formed so as to cover the island-like semiconductor film 123, and a gate electrode 125 is formed over the island-like semiconductor film 123 and the insulating film 124. The gate electrode 125 may be formed in a similar manner to the gate electrode 111 (see FIG. 3B).

After formation of the gate electrode 125, an impurity element imparting one conductivity type may be introduced to the island-like semiconductor film 123. The concentration of the impurity element at this time is lower than the concentration of an impurity element in a later step of adding the impurity element to form impurity regions 141 (an impurity region 141a and an impurity region 141b).

Figure 3B:
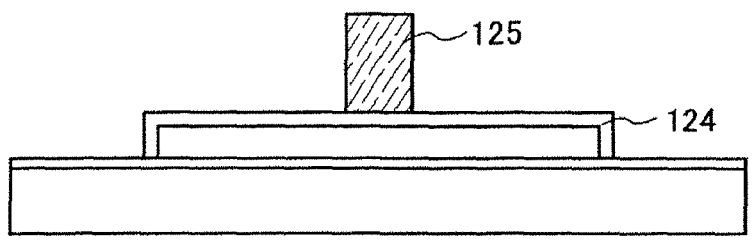
Figure 3C:
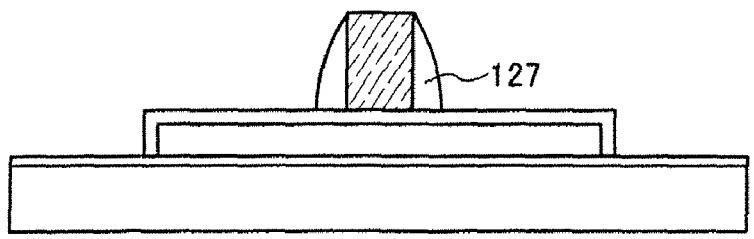

Then, an insulating film is formed over the island-like semiconductor film 123, the insulating film 124, and the gate electrode 125, and anisotropic etching is performed, whereby sidewalls 127 are formed on the side surfaces of the gate electrode 125 (see FIG. 3C).

Figure 3D:
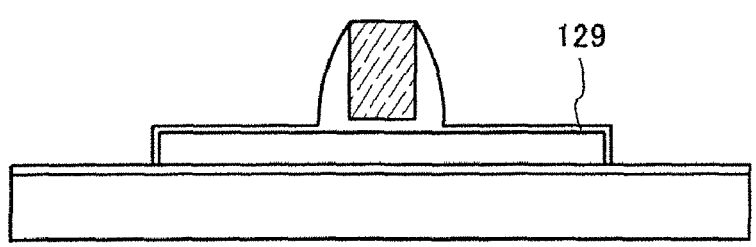

Next, the insulating film 124 in a region where the gate electrode 125 or the sidewalls 127 are not formed is removed by etching, and the island-like semiconductor film 123 which is exposed is treated with ozone water or a hydrogen peroxide solution, or oxidized by a UV ozone method, so that an oxide film 129 of the island-like semiconductor film is formed on the surface of the island-like semiconductor film 123 (see FIG. 3D). The oxide film 129 has a thickness of 0.5 to 3 nm, which is very thin.

Figure 3E:
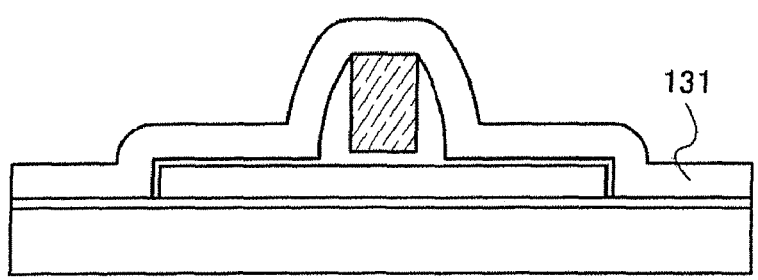

A semiconductor film 131 is formed so as to cover the oxide film 129, the sidewalls 127, and the gate electrode 125 (see FIG. 3E). The semiconductor film 131 may be any one of an amorphous semiconductor film, a crystalline semiconductor film, and a microcrystalline semiconductor film (also referred to as a semi-amorphous semiconductor film).

Figure 3F:
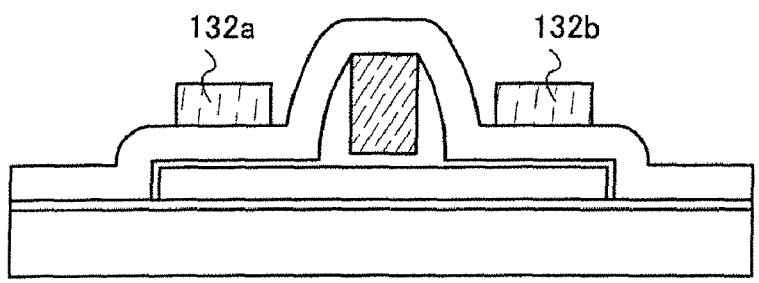

After formation of the semiconductor film 131, resist masks 132 (132a and 132b) are formed over the semiconductor film 131 in regions near the end portions of the island-like semiconductor film 123 (see FIG. 3F).

The semiconductor film 131 is etched using the resist masks 132 as masks. In etching the semiconductor film 131, the oxide film 129 serves as an etching stopper and prevents the island-like semiconductor film 123 from being etched.

In this embodiment mode, the semiconductor film 131 is etched by wet etching.

Figure 4A:
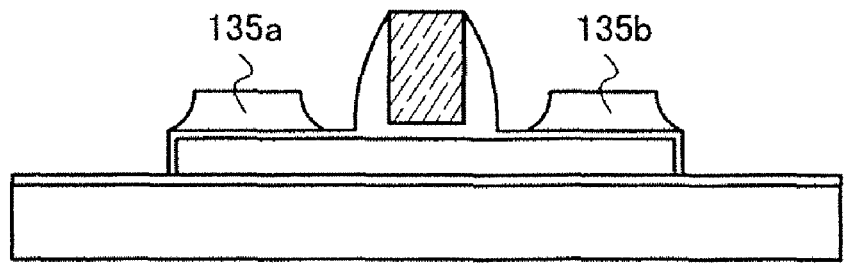
FIGS. 4A to 4C are cross-sectional views showing the manufacturing process of the semiconductor device according to an aspect of the present invention.
Figure 4B:
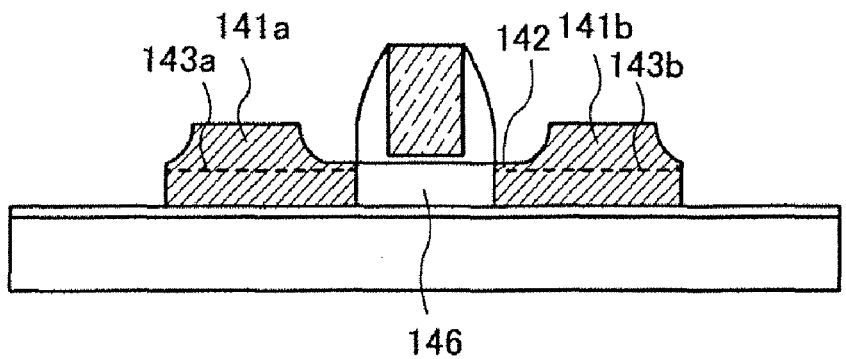

Accordingly, semiconductor films 135 (135a and 135b) are formed over the regions near the end portions of the island-like semiconductor film 123 (see FIG. 4A).

Instead of forming the semiconductor films 135 by depositing and etching the semiconductor film 131, an organic solvent including polysilane and cyclopentasilane may be applied, and a silicon film may be selectively formed over the oxide film 129 by an ink-jet method.

Alternatively, after applying and baking an organic solvent including polysilane and cyclopentasilane instead of depositing the semiconductor film 131, the resist masks 132 may be formed, and the semiconductor films 135 may be formed by etching.

Then, an impurity element imparting one conductivity type is added to the semiconductor films 135 using the gate electrode 125 and the sidewalls 127 as a mask. As an impurity element imparting n-type conductivity, phosphorus (P) or arsenic (As) can be used, for example. In addition, as an impurity element imparting p-type conductivity, boron (B) can be used, for example.

The impurity element imparting one conductivity type is added by an ion doping method or an ion implantation method at an accelerating voltage (also referred to as an application voltage) of 5 to 80 kV. In this addition step, ions collided with oxygen, silicon, or the like included in the very thin oxide film 129, which is a very thin silicon oxide film in this embodiment mode, and oxygen or silicon scatters or jumps, that is, ion mixing occurs. The impurity element imparting one conductivity type is added at a concentration in the range of $1 \times 10^{14}$ to $1 \times 10^{16}$ atoms/cm$^2$, and may also be added twice or more at different accelerating voltage.

Through the step of adding the impurity element, a channel formation region 146 is formed in a region which is in the island-like semiconductor film 123 and below the gate electrode 125 and the sidewalls 127. A gate insulating film 142 is formed over the channel formation region 146. Regions which are in the island-like semiconductor film 123 and to which the impurity element is added and the semiconductor films 135 become the impurity regions 141 (the impurity region 141a and the impurity region 141b). The very thin oxide films 129 which are in the impurity regions 141 become oxide films 143 (an oxide film 143a and an oxide film 143b of the semiconductor film) in which ion mixing has occurred (see FIG. 4B).

After that, the impurity element which is added is activated with laser activation, rapid thermal annealing (RTA), annealing using a furnace, or the like. In particular, when the temperature of the island-like semiconductor film 123 and the semiconductor films 135 becomes greater than or equal to 700° C., particularly greater than or equal to 1000° C. with laser activation or RTA, oxygen is more diffused and the oxide films 143 in which ion mixing has occurred disappear. In addition, when the oxide films 143 and the semiconductor film in the periphery thereof are melted in laser activation, the oxide films 143 are likely to disappear at least partly. At the same time, crystal growth, that is, epitaxial growth of the semiconductor films 135 progresses in accordance with a crystal condition of the island-like semiconductor film 123. Accordingly, the semiconductor films 135 come to have n-type or p-type conductivity and lower resistance and become n-type or p-type crystalline semiconductor films.

Figure 4C:
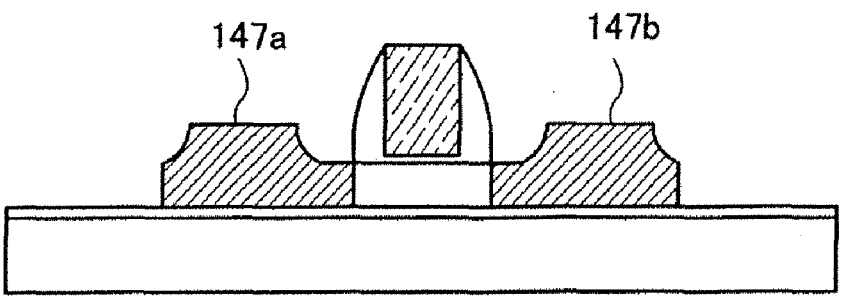

In the above manner, the channel formation region 146, a region 147a which is one of a source region and a drain region, and a region 147b which is the other of the source region and the drain region are formed (see FIG. 4C).

Figure 8A:
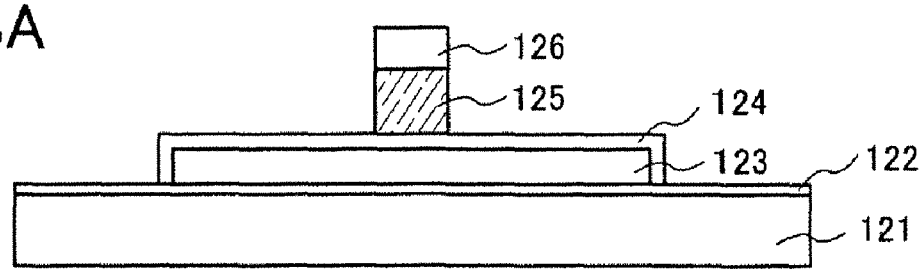
FIGS. 8A to 8E are cross-sectional views showing a manufacturing process of a semiconductor device according to an aspect of the present invention.
Figure 8B:
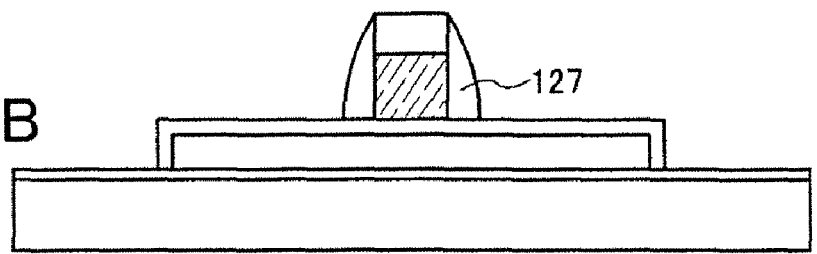
Figure 8C:
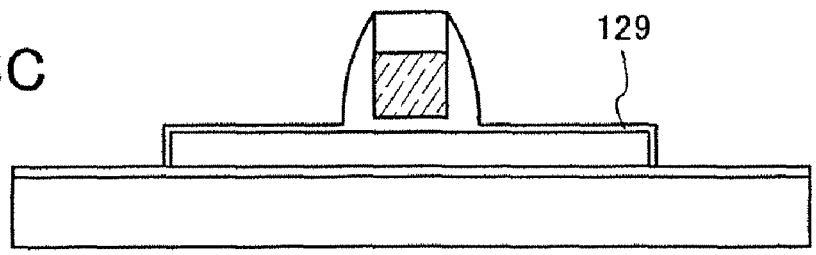
Figure 8D:
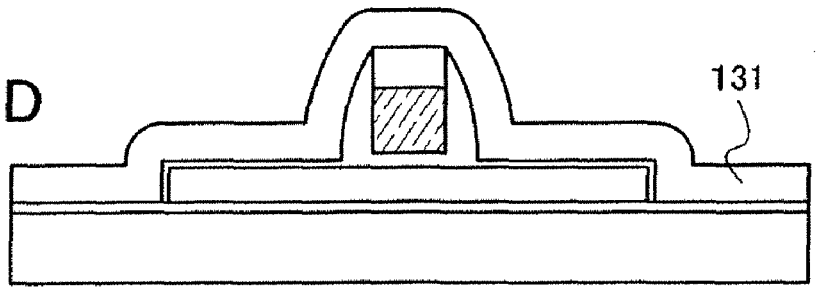
Figure 8E:
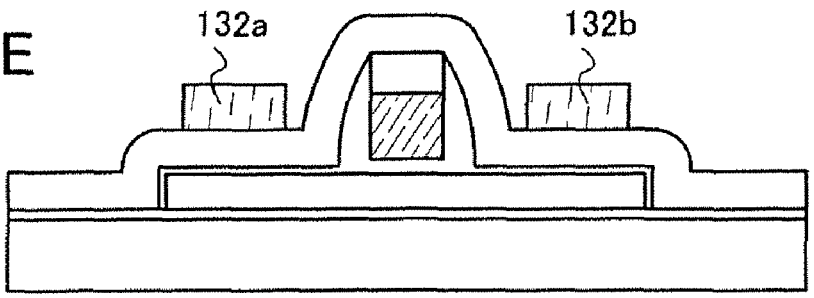
Figure 9A:
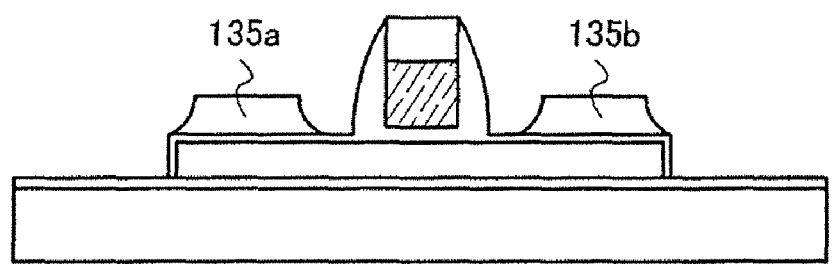
FIGS. 9A to 9C are cross-sectional views showing the manufacturing process of the semiconductor device according to an aspect of the present invention.
Figure 9B:
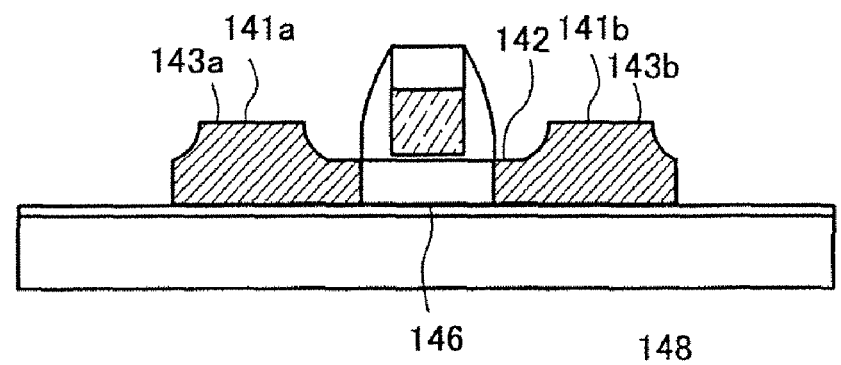
Figure 9C:
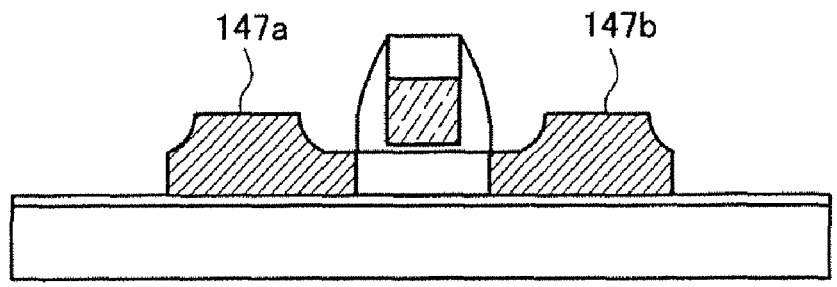

Alternatively, after formation of the gate electrode 125 shown in FIG. 3B, an insulating film 126 may be formed over the gate electrode 125 (see FIG. 8A). The insulating film 126 may be formed using any one of a silicon oxide film, a silicon oxide film including nitrogen, a silicon nitride film, and a silicon nitride film including oxygen, or a stacked film including two or more of them.

Then, a thin film transistor is manufactured through the same manufacturing steps as in FIGS. 3C to 3F and FIGS. 4A to 4C (see FIGS. 8B to 8E and FIGS. 9A to 9C).

Embodiment Mode 3

In this embodiment mode, a semiconductor device which is capable of wireless communication using the TFT in accordance with Embodiment Modes 1 and 2 will be described with reference to FIG. 5 and FIGS. 6A and 6B.

Figure 5:
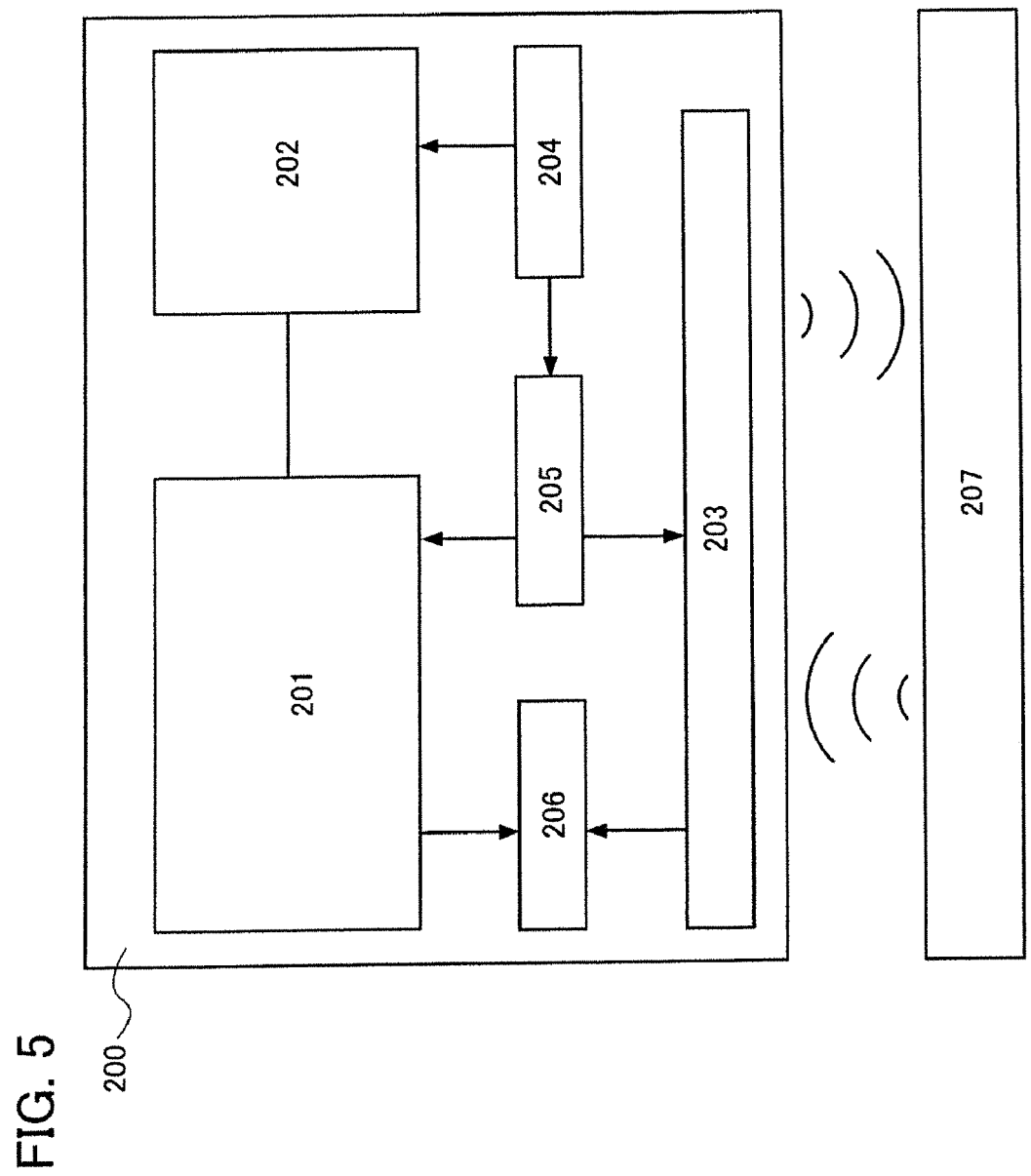
FIG. 5 is a diagram showing one mode utilizing a semiconductor device according to an aspect of the present invention.

As shown in FIG. 5, a semiconductor device 200 of this embodiment mode which is capable of wireless communication includes an arithmetic processing circuit 201, a memory circuit 202, an antenna 203, a power supply circuit 204, a demodulation circuit 205, and a modulation circuit 206. The antenna 203 and the power supply circuit 204 are necessary components of the semiconductor device 200 which is capable of wireless communication. Components other than those are provided as appropriate to suit the application of the semiconductor device 200 which is capable of wireless communication.

The TFT manufactured in accordance with Embodiment Modes 1 and 2 can be applied to the arithmetic processing circuit 201, the memory circuit 202, the power supply circuit 204, the demodulation circuit 205, and the modulation circuit 206.

The arithmetic processing circuit 201 analyzes instructions, controls the memory circuit 202, outputs data which is to be transmitted to the outside to the modulation circuit 206, and so on, based on signals input from the demodulation circuit 205.

The memory circuit 202 includes a circuit which includes a memory element and a control circuit which reads and writes data. At least an individual identification number of the semiconductor device itself is stored in the memory circuit 202. The individual identification number is used to distinguish the semiconductor device from other semiconductor devices. Further, the memory circuit 202 may be formed using the TFT described in Embodiment Mode 1 or 2.

The antenna 203 converts a carrier wave supplied from a reader/writer 207 into an AC electric signal. Further, load modulation is applied by the modulation circuit 206. The power supply circuit 204 generates power supply voltage by using the AC electric signal converted by the antenna 203, and supplies the power supply voltage to each circuit.

The demodulation circuit 205 demodulates the AC electric signal converted by the antenna 203 and supplies the demodulated signal to the arithmetic processing circuit 201. The modulation circuit 206 applies load modulation to the antenna 203 based on the signal supplied from the arithmetic processing circuit 201.

The reader/writer 207 receives as a carrier wave the load modulation applied to the antenna 203. Further, the reader/writer 207 transmits the carrier wave to the semiconductor device 200 which is capable of wireless communication. Note that the carrier wave is an electromagnetic wave which the reader/writer 207 transmits and receives, and the reader/writer 207 receives the carrier wave which has been modulated by the modulation circuit 206.

Figure 6A:
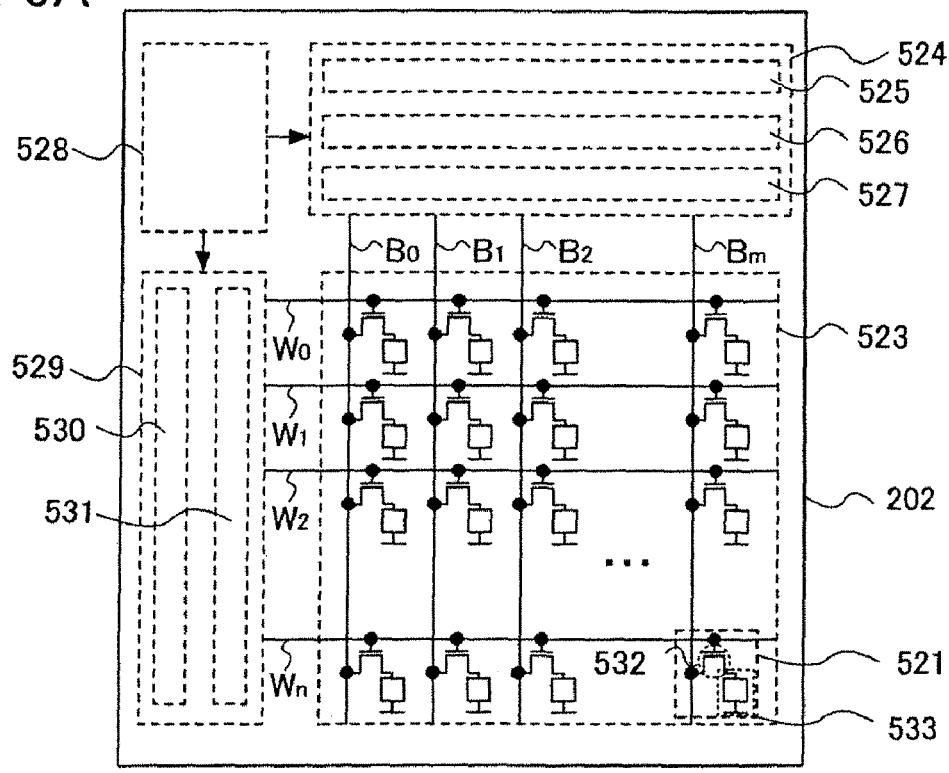
FIGS. 6A and 6B are circuit diagrams showing a semiconductor device provided with a TFT according to an aspect of the present invention.

FIG. 6A shows an example of a structure of the memory circuit 202 in which memory elements are arranged in matrix form. The memory circuit 202 includes a memory cell array 523 in which memory cells 521 are provided in matrix form; a bit line driver circuit 524 which includes a column decoder 525, a reading circuit 526, and a selector 527; a word line driver circuit 529 which includes a row decoder 530 and a level shifter 531; and an interface 528 which includes a writing circuit and the like and communicates with the outside. Note that the structure of the memory circuit 202 described here is only an example. The memory circuit 202 may include another circuit, such as a sense amplifier, an output circuit, or a buffer; and the writing circuit may be provided in the bit line driver circuit.

The memory cell 521 includes a first wiring which forms a word line $W_y$ ($0 \leq y \leq n$), a second wiring which forms a bit line $B_x$ ($0 \leq x \leq m$), a TFT 532, and a memory element 533.

Operations of writing to the memory cell and reading the memory cell of the present invention will now be described with reference to FIG. 6B. Note that here, a state in which '0' has been written to the memory cell is referred to as a second state, and a state in which '1' has been written to the memory cell is referred to as a first state.

First, an example of a circuit operation for writing '0' to the memory cell 521 will be described. A writing process is performed by selecting a word line $W_0$ of the memory cell 521 and flowing current through a bit line $B_0$. That is, the memory cell to which it is desired that writing be performed may be selected by the word line $W_0$, and voltage may be applied which can shift the memory element 533 from the first state to the second state and can cause insulation. For example, this voltage is 10 V. At this time, in order to prevent writing to memory elements 506, 507, and 508 in other memory cells from being performed, TFTs 502, 503, and 504 are turned off. For example, the word line W, and the bit line $B_1$ are supplied with 0 V. A state in which '0' is written to the memory element 533 can be brought about by applying a voltage sufficient to shift the memory element 533 from the first state to the second state to the bit line $B_0$ when only the word line $W_0$ is selected.

An example of a reading operation to the memory cell 521 will now be described. In a reading operation, it is determined whether the memory cell 521 is in the first state, in which '1' is written to the memory element 533, or the second state, in which '0' is written to the memory element 533. For example, the case will be described where it is read whether the memory cell 521 is in the state in which '0' is written, or the state in which '1' is written. The memory element 533 is in the state in which '0' has been written; that is, the memory element 533 is insulated. The word line $W_0$ is selected and the TFT 532 is turned on. Here, while the TFT 532 is in an 'on' state, a voltage which is greater than or equal to a predetermined voltage is applied to the bit line $B_0$. Here, the predetermined voltage is 5 V. At this time, if the memory element 533 is in the first state; that is, if the memory element 533 is not insulated, current flows to a wiring which is grounded in the memory cell 521, and voltage of the bit line $B_0$ becomes 0 V. Conversely, if the memory element 533 is in the second state; that is, if the memory element 533 is insulated, current does not flow to the wiring which is grounded in the memory cell 521, and the voltage of the bit line $B_0$ is maintained at 5 V. Thus, whether '0' is written or '1' is written can be determined by the voltage of the bit line.

Figure 6B:
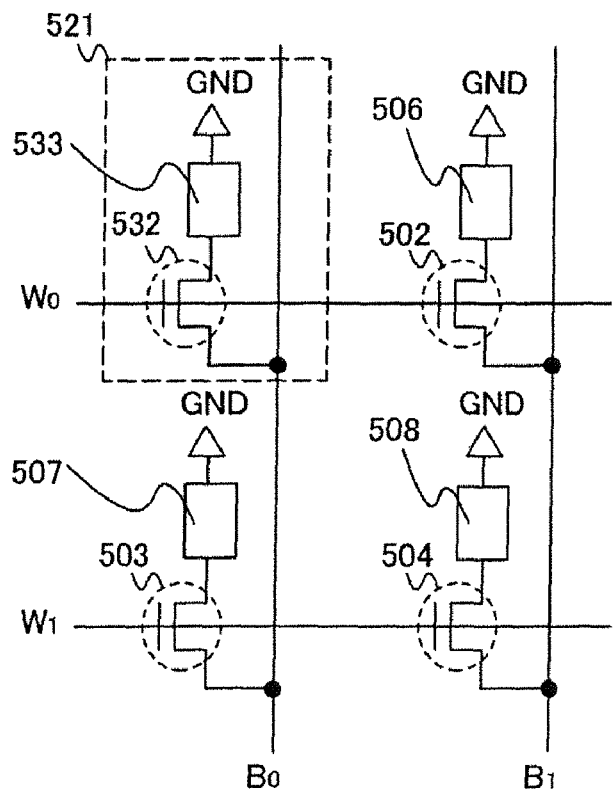

For example, the TFTs 532, 503, 502, and 504 shown in FIG. 6B can each be formed using the TFT shown in FIG. 1H of Embodiment Mode 1 or the TFT shown in FIG. 4C of Embodiment Mode 2.

Thus, the TFT of the present invention can be applied to a semiconductor device which is capable of wireless communication.

Embodiment Mode 4

Figure 7A:
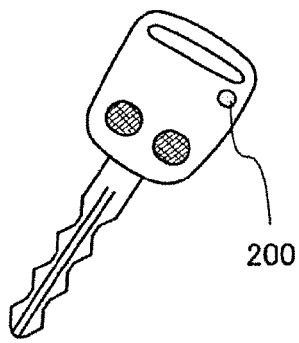
FIGS. 7A to 7F are drawings each showing an example of an object on which a semiconductor device according to an aspect of the present invention is mounted.
Figure 7B:
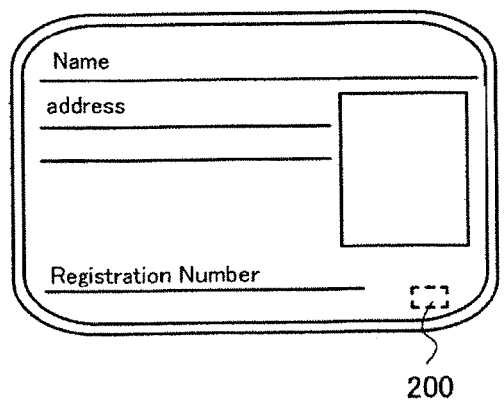
Figure 7C:
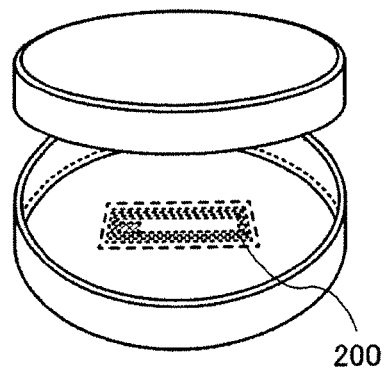
Figure 7D:
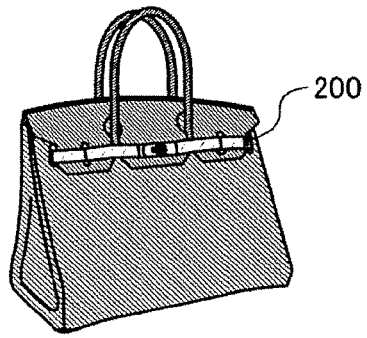
Figure 7E:
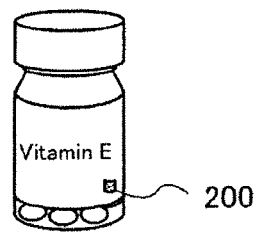
Figure 7F:
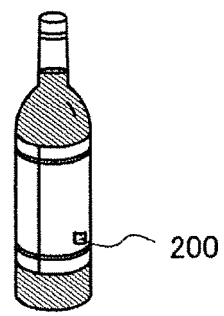

The semiconductor device 200, which is capable of wireless communication, manufactured in accordance with Embodiment Mode 3 can be used for a variety of items and systems by utilizing its function of transmitting and receiving electromagnetic waves. Examples of items to which the semiconductor device 200 which is capable of wireless communication can be applied are keys (see FIG. 7A), paper money, coins, securities, bearer bonds, documents (e.g., driver's licenses or resident's cards; see FIG. 7B), books, containers (e.g., petri dishes; see FIG. 7C), packaging containers (e.g., wrapping paper or bottles; see FIGS. 7E and 7F), recording media (e.g., disks or video tapes), means of transportation (e.g., bicycles), personal accessories (e.g., bags or eyeglasses; see FIG. 7D), food, clothing, everyday articles, electronic devices (e.g., liquid crystal display devices, EL display devices, television devices, and portable terminals), and the like.

The semiconductor device 200, which is capable of wireless communication, manufactured by applying the present invention is fixed to items of a variety of forms, such as those above, by being attached to or embedded in a surface. Further, a system refers to a goods management system, a system having an authentication function, a distribution system, or the like. By using the semiconductor device of the present invention, the system can be made more sophisticated and multifunctional and can have a higher added value.

Embodiment Mode 5

In this embodiment mode, an example of manufacturing a transistor using a single crystal semiconductor substrate will be described with reference to FIGS. 20A to 20E, FIGS. 21A to 21D, and FIGS. 22A to 22C.

Figure 20A:
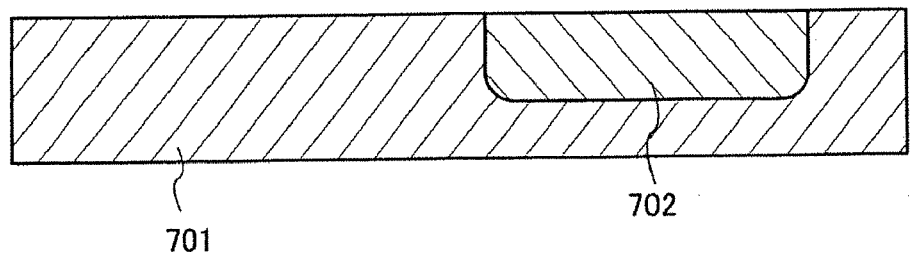
FIGS. 20A to 20E are cross-sectional views showing a manufacturing process of a semiconductor device according to an aspect of the present invention.

First, an n-type semiconductor region 702 is formed in a p-type semiconductor substrate 701 (see FIG. 20A). Alternatively, the p-type semiconductor substrate 701 may be an n-type semiconductor substrate, and the n-type semiconductor region 702 may be a p-type semiconductor region.

Figure 20B:
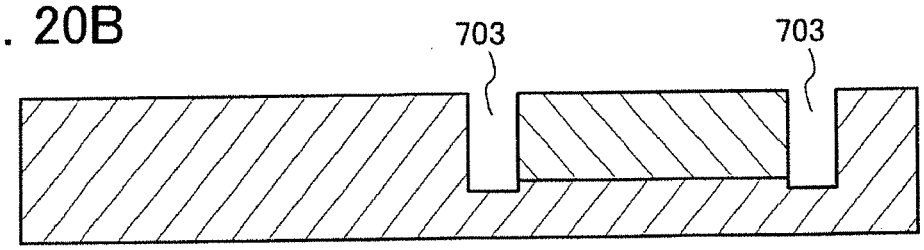
Figure 20C:
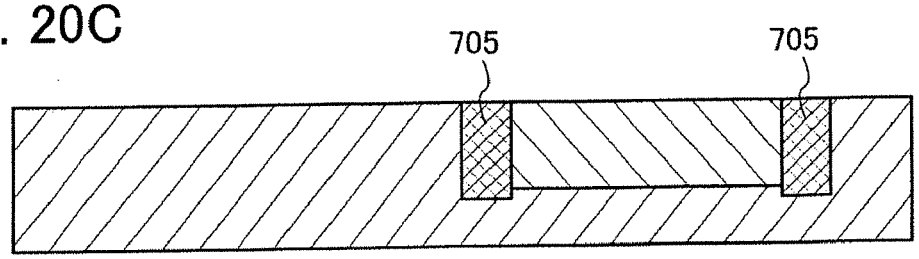

A groove 703 is formed at a boundary of the n-type semiconductor region 702 (see FIG. 20B). Then, the p-type semiconductor substrate 701 is heated, and the groove 703 is thermally oxidized, so that an oxide 705 is formed. With the oxide 705, an n-channel transistor and a p-channel transistor which are formed later are insulated and separated.

Figure 20D:
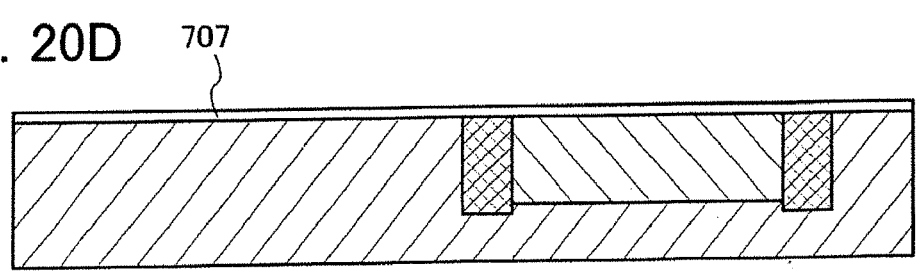

In accordance with Embodiment Mode 1, an oxide film, an oxide film including nitrogen, a nitride film including oxygen, or a nitride film, which is formed using a semiconductor film and very thin, is formed on the p-type semiconductor substrate 701 and the n-type semiconductor region 702. FIG. 20D shows an example in which a very thin oxide film 707 of the semiconductor film is formed over the p-type semiconductor substrate 701 and the n-type semiconductor region 702.

Figure 20E:
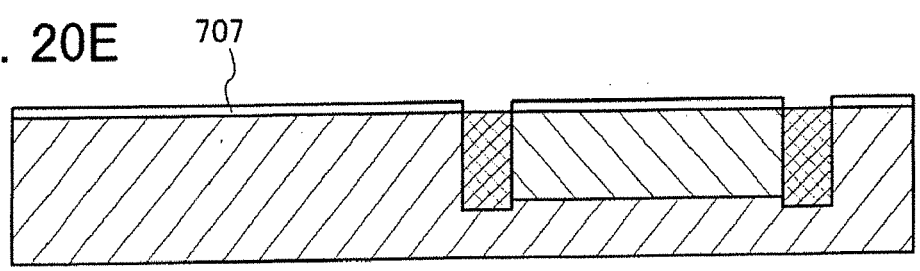

Alternatively, in accordance with Embodiment Mode 1, the p-type semiconductor substrate 701 and the n-type semiconductor region 702 are oxidized or nitrided, and an oxide film, an oxide film including nitrogen, a nitride film including oxygen, or a nitride film, which is formed using a semiconductor film and very thin, is formed. FIG. 20E shows an example in which very thin oxide films 707 of the semiconductor film are formed on the p-type semiconductor substrate 701 and the n-type semiconductor region 702. A process for manufacturing a semiconductor device using the structure shown in FIG. 20E will be described.

Figure 21A:
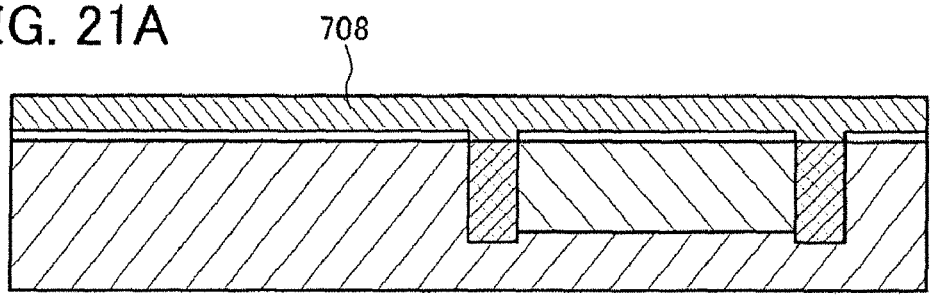
FIGS. 21A to 21D are cross-sectional views showing the manufacturing process of the semiconductor device according to an aspect of the present invention.

A semiconductor film 708 is formed over the oxide films 707 and the oxides 705 (see FIG. 21A). The semiconductor film 708 may be formed using a material and a manufacturing process similar to those of the semiconductor film 108.

Figure 21B:
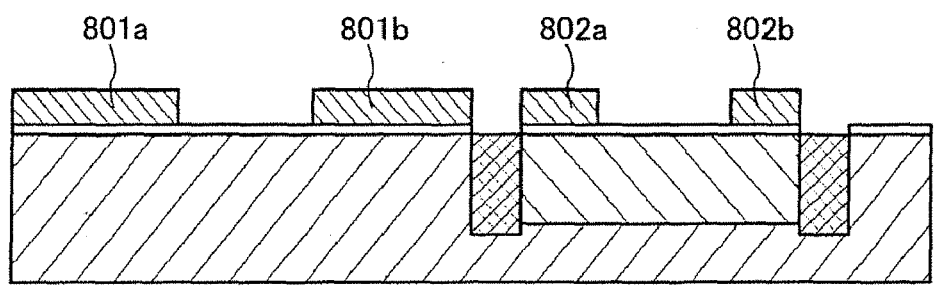

The semiconductor film 708 is etched, and semiconductor films 801 (a semiconductor film 801a and a semiconductor film 801b) are formed over regions near end portions of a region where the n-channel transistor is formed, and semiconductor films 802 (a semiconductor film 802a and a semiconductor film 802b) are formed over regions near end portions of a region where the p-channel transistor is formed (see FIG. 21B).

Next, an insulating film 810 is formed so as to cover the oxide films 707, the oxides 705, the semiconductor films 801, and the semiconductor films 802. Alternatively, the insulating film 810 may be formed after removing the oxide films 707 which are not covered with the semiconductor films 801 or the semiconductor films 802. The insulating film 810 may be formed using any one of a silicon oxide film, a silicon oxide film including nitrogen, a silicon nitride film including oxygen, and a silicon nitride film, or a stacked film including two or more of them.

Figure 21C:
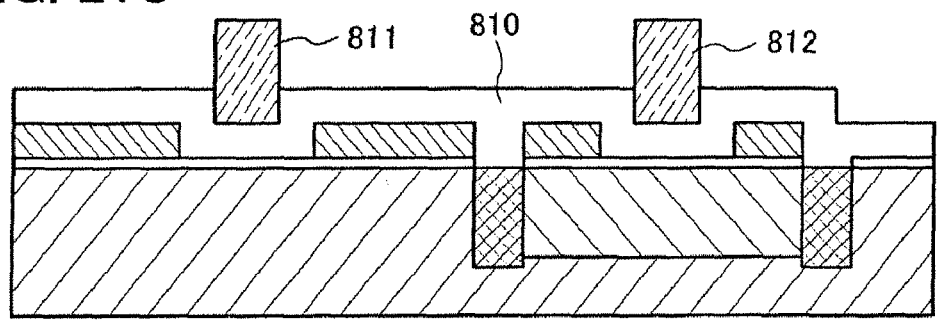

A gate electrode 811 and a gate electrode 812 are formed on the insulating film 810 (see FIG. 21C). The gate electrode 811 and the gate electrode 812 may be formed using a material similar to that of the gate electrode 111.

Figure 21D:
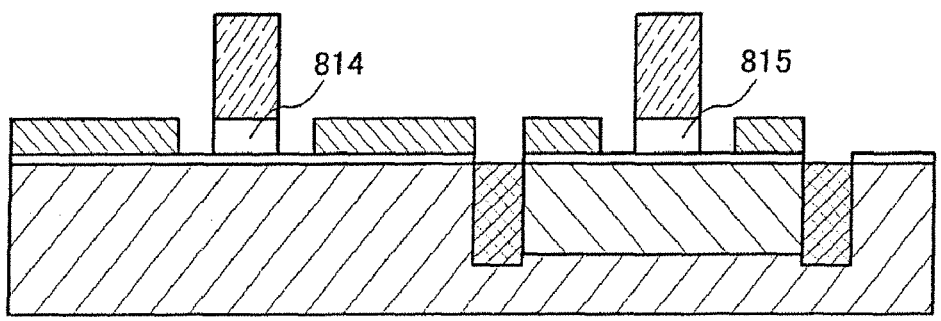
Figure 22A:
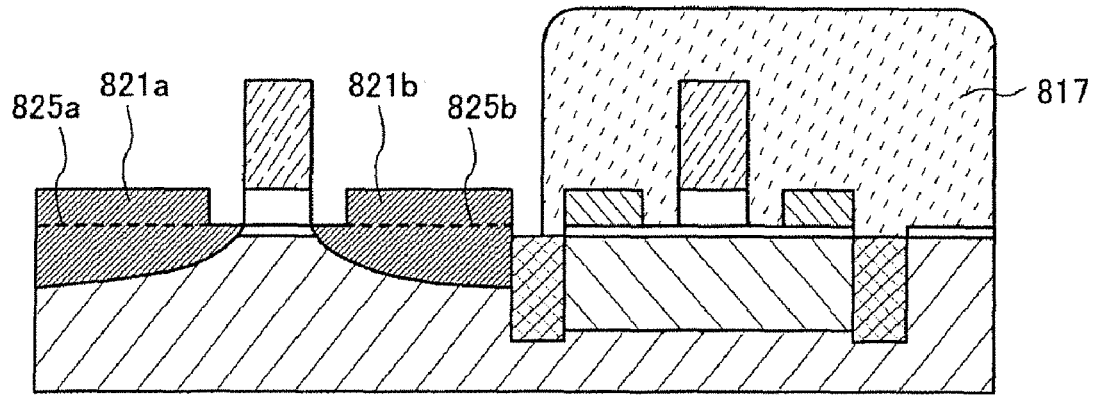
FIGS. 22A to 22C are cross-sectional views showing the manufacturing process of the semiconductor device according to an aspect of the present invention.
Figure 22B:
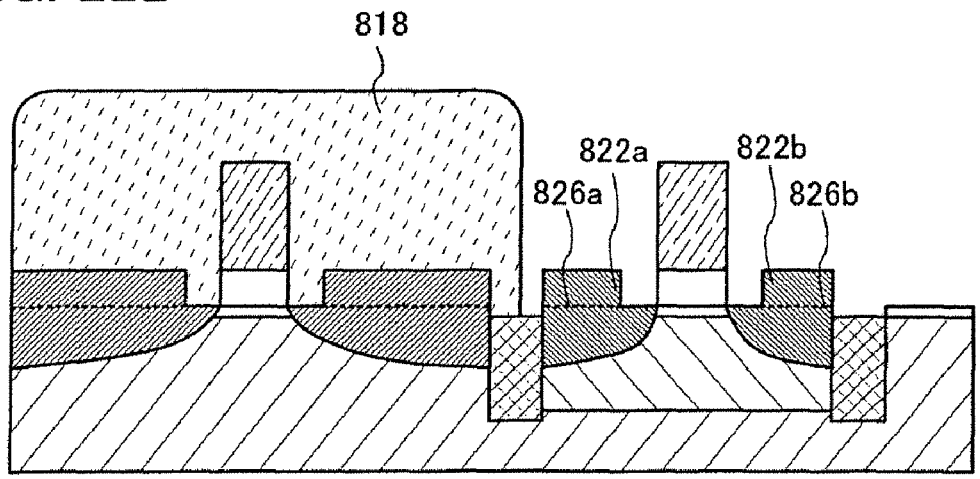
Figure 22C:
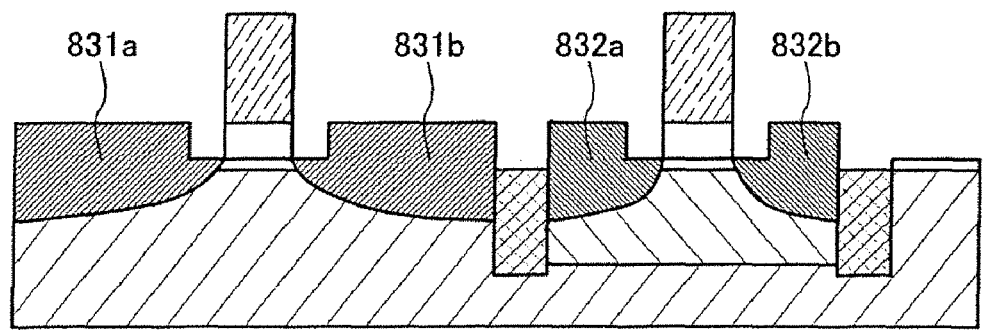

The insulating film 810 is etched using the gate electrodes 811 and 812 as masks, and an insulating film 814 and an insulating film 815 are formed under the gate electrode 811 and the gate electrode 812, respectively (see FIG. 21D). The oxide film 707 and the insulating film 814 under the gate electrode 811 collectively serve as a gate insulating film of the n-channel transistor. Further, the oxide film 707 and the insulating film 815 under the gate electrode 812 collectively serve as a gate insulating film of the p-channel transistor.

A resist 817 is formed over the region which becomes the p-channel transistor, and an impurity element imparting n-type conductivity is added to the semiconductor films 801 and the p-type semiconductor substrate 701 in the region which becomes the n-channel transistor. As the impurity element imparting n-type conductivity, phosphorus (P) or arsenic (As) may be used.

In this addition step, ions collided with oxygen, silicon, or the like included in the oxide film 707, and oxygen or silicon scatters or jumps, that is, ion mixing occurs.

The semiconductor films 801 and regions in the p-type semiconductor substrate 701 to which the impurity element imparting n-type conductivity is added become impurity regions 821 (an impurity region 821*a* and an impurity region 821*b*). The oxide films 707 in the impurity regions 821 become oxide films 825 (an oxide film 825*a* and an oxide film 825*b*) in which ion mixing has occurred (see FIG. 22A).

A resist 818 is formed over the region which becomes the n-channel transistor, and an impurity element imparting p-type conductivity is added to the semiconductor films 802 and the n-type semiconductor region 702 in the region which becomes the p-channel transistor. As the impurity element imparting p-type conductivity, boron (B) may be used.

The impurity element imparting n-type or p-type conductivity may be added at a concentration in the range of $1 \times 10^{14}$ to $1 \times 10^{16}$ atoms/cm$^2$, and may also be added twice or more at different accelerating voltage.

In this addition step, ions collided with oxygen, silicon, or the like included in the oxide film 707, and oxygen or silicon scatters or jumps, that is, ion mixing occurs.

The semiconductor films 802 and regions in the n-type semiconductor region 702 to which the impurity element imparting n-type conductivity is added become impurity regions 822 (an impurity region 822*a* and an impurity region 822*b*). The oxide films 707 in the impurity regions 822 become oxide films 826 (an oxide film 826*a* and an oxide film 826*b*) in which ion mixing has occurred (see FIG. 22B).

After that, the impurity element which is added is activated with laser activation, rapid thermal annealing (RTA), annealing using a furnace, or the like. In particular, when the temperature of the p-type semiconductor substrate 701, the n-type semiconductor region 702, the impurity regions 821, and the impurity regions 822 becomes greater than or equal to 700° C., particularly greater than or equal to 1000° C. with laser activation or RTA, oxygen is more diffused and the oxide films 825 and 826 in which ion mixing has occurred disappear at least partly. In addition, when the oxide films 825 and 826 and the semiconductor film in the periphery thereof are melted in laser activation, the oxide films 825 and 826 are likely to disappear.

In the above manner, a region 831*a* which is one of a source region and a drain region, a region 831*b* which is the other of the source region and the drain region, and a channel formation region between the region 831*a* and the region 831*b* are formed to achieve the n-channel transistor. In addition, a region 832*a* which is one of a source region and a drain region, a region 832*b* which is the other of the source region and the drain region, and a channel formation region between the region 832*a* and the region 832*b* are formed to achieve the p-channel transistor (see FIG. 22C).

This application is based on Japanese Patent Application Serial No. 2007-289750 filed with Japan Patent Office on Nov. 7, 2007, the entire contents of which are hereby incorporated by reference.

What is claimed is:

1. A method for manufacturing a semiconductor device, comprising the steps of:
    forming an island-like semiconductor film over a substrate having an insulating surface;
    oxidizing or nitriding a surface of the island-like semiconductor film to form a first insulating film which is any one of an oxide film, an oxide film including nitrogen, a nitride film including oxygen, a nitride film, a film including a suboxide, and a film including a subnitride on the surface of the island-like semiconductor film;
    forming a semiconductor film on a region which is a part of the first insulating film;
    oxidizing or nitriding the surface of the island-like semiconductor film to form a second insulating film which is any one of an oxide film, an oxide film including nitrogen, a nitride film including oxygen, a nitride film, a film including a suboxide, and a film including a subnitride on the surface of the island-like semiconductor film;
    forming a gate electrode over the first insulating film and the second insulating film;
    adding an impurity element imparting one conductivity type to the island-like semiconductor film and the semiconductor film using the gate electrode as a mask; and
    heating the island-like semiconductor film and the semiconductor film to activate the impurity element,
    wherein the first insulating film disappears by heating the island-like semiconductor film and the semiconductor film.

2. The method for manufacturing the semiconductor device according to claim 1, wherein the island-like semiconductor film is a crystalline semiconductor film whose main component is silicon.

3. The method for manufacturing the semiconductor device according to claim 1, wherein the island-like semiconductor film is a single crystal semiconductor layer whose main component is silicon.

4. The method for manufacturing the semiconductor device according to claim 1, wherein a main component of the semiconductor film is silicon.

5. The method for manufacturing the semiconductor device according to claim 1, wherein a thickness of the first insulating film is greater than or equal to 0.2 nm and less than or equal to 4 nm.

* * * * *